US012469785B2

(12) United States Patent
Xie et al.

(10) Patent No.: US 12,469,785 B2
(45) Date of Patent: Nov. 11, 2025

(54) BACKSIDE POWER RAIL WITH TIGHT SPACE

(71) Applicant: INTERNATIONAL BUSINESS MACHINES CORPORATION, Armonk, NY (US)

(72) Inventors: Ruilong Xie, Niskayuna, NY (US); Koichi Motoyama, Clifton Park, NY (US); Nicholas Anthony Lanzillo, Wynantskill, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 567 days.

(21) Appl. No.: 17/935,138

(22) Filed: Sep. 26, 2022

(65) Prior Publication Data

US 2024/0105606 A1   Mar. 28, 2024

(51) Int. Cl.
| | |
|---|---|
| *H01L 23/528* | (2006.01) |
| *H01L 21/02* | (2006.01) |
| *H01L 21/28* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |

(Continued)

(52) U.S. Cl.
CPC .... *H01L 23/5286* (2013.01); *H01L 21/02532* (2013.01); *H01L 21/02603* (2013.01); *H01L 21/28123* (2013.01); *H10D 30/014* (2025.01); *H10D 30/43* (2025.01); *H10D 30/6729* (2025.01); *H10D 30/6735* (2025.01); *H10D 62/121* (2025.01); *H10D 84/0167* (2025.01); *H10D 84/0186* (2025.01); *H10D 84/0188* (2025.01); *H10D 84/038* (2025.01); *H10D 84/85* (2025.01); *H10D 84/981* (2025.01)

(58) Field of Classification Search
None
See application file for complete search history.

(56) References Cited

U.S. PATENT DOCUMENTS

| | | |
|---|---|---|
| 9,570,395 B1 | 2/2017 | Sengupta |
| 10,586,765 B2 | 3/2020 | Smith |
| | (Continued) | |

*Primary Examiner* — Jessica S Manno
*Assistant Examiner* — Pinaki Das
(74) *Attorney, Agent, or Firm* — Kristofer Haggerty

(57) ABSTRACT

A first power rail directly below and connected to a source-drain epitaxy region of a positive field effect transistor (p-FET) region, a second power rail directly below and connected to a source-drain epitaxy region of a negative field effect transistor (n-FET) region, the first power rail and the second power rail each comprise vertical side surfaces which taper in an opposite direction from each other. Forming a first power rail by subtractive metal etch, where the first power rail is directly below and connected to a source-drain epitaxy region of a p-FET region and forming a second power rail by damascene process, where the second power rail is directly below and connected to a source-drain epitaxy region of an n-FET region, the first power rail and the second power rail each comprise vertical side surfaces which taper in an opposite direction from each other.

20 Claims, 43 Drawing Sheets

Section Y2-Y2

(51) Int. Cl.
*H10D 84/85* (2025.01)
*H10D 84/90* (2025.01)

(56) References Cited

U.S. PATENT DOCUMENTS

| | | |
|---|---|---|
| 10,636,739 B2 | 4/2020 | Beyne |
| 10,700,207 B2 | 6/2020 | Chen |
| 10,734,224 B2 | 8/2020 | Smith |
| 10,797,139 B2 | 10/2020 | Morrow |
| 11,121,034 B2 | 9/2021 | Tsunami |
| 11,239,325 B2 | 2/2022 | Huang |
| 2020/0075574 A1 | 3/2020 | Smith |
| 2020/0105671 A1 | 4/2020 | Lai |
| 2020/0135634 A1* | 4/2020 | Chiang ................ H10D 64/251 |
| 2021/0082755 A1 | 3/2021 | Wang |
| 2021/0111115 A1 | 4/2021 | Morrow |
| 2021/0134721 A1 | 5/2021 | Chiang |
| 2021/0202385 A1 | 7/2021 | Huang |
| 2021/0210489 A1 | 7/2021 | Zhang |
| 2021/0358849 A1 | 11/2021 | Chen |
| 2021/0366907 A1* | 11/2021 | Liao .................. H10D 84/8311 |
| 2021/0375861 A1 | 12/2021 | Chung |
| 2021/0391254 A1 | 12/2021 | You |
| 2022/0013522 A1* | 1/2022 | Li ...................... H10D 84/0193 |
| 2022/0052157 A1 | 2/2022 | Chang |
| 2022/0208679 A1* | 6/2022 | Lee ....................... H01L 23/535 |
| 2022/0301878 A1* | 9/2022 | Xie .................... H01L 21/76898 |
| 2022/0344496 A1* | 10/2022 | Su ....................... H10D 62/116 |

* cited by examiner

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

Section X-X

Section Y1-Y1

Section Y2-Y2

BACKSIDE POWER RAIL WITH TIGHT SPACE

BACKGROUND

The present invention relates, generally, to the field of semiconductor manufacturing, and more particularly to forming backside power rails with tight n-type field effect transistor (hereinafter "FET") to p-type FET spacing.

Complementary Metal-oxide-semiconductor (CMOS) technology is commonly used for FET as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel. As devices are scaled further, resulting in possible N2P (n-type FET to p-type FET) shorts in a backside power rail.

SUMMARY

According to an embodiment, a semiconductor device is provided. The semiconductor device includes a first backside power rail directly below and connected to a source-drain epitaxy region of a positive field effect transistor (p-FET) region, a second backside power rail directly below and connected to a source-drain epitaxy region of a negative field effect transistor (n-FET) region, where vertical side surfaces of the first backside power rail are tapered and a width of an upper horizontal surface of the first backside power rail is greater than a width of a lower horizontal surface of the first backside power rail, where vertical side surfaces of the second backside power rail are tapered and a width of an upper horizontal surface of the second backside power rail is less than a width of a lower horizontal surface of the second backside power rail, where the first backside power rail and the second backside power rail each include vertical side surfaces which taper in an opposite direction from each other.

According to an embodiment, a semiconductor device is provided. The semiconductor device includes a first backside power rail directly below and connected to a source-drain epitaxy region of a positive field effect transistor (p-FET) region, a second backside power rail directly below and connected to a source-drain epitaxy region of a negative field effect transistor (n-FET) region, where vertical side surfaces of the first backside power rail are tapered and a width of an upper horizontal surface of the first backside power rail is greater than a width of a lower horizontal surface of the first backside power rail, where vertical side surfaces of the second backside power rail are tapered and a width of an upper horizontal surface of the second backside power rail is less than a width of a lower horizontal surface of the second backside power rail, where the first backside power rail and the second backside power rail each include vertical side surfaces which taper in an opposite direction from each other, and a high-k dielectric spacer between the first backside power rail and the second backside power rail, where the high-k spacer includes a k value of greater than 5.

According to an embodiment, a method is provided. The method including forming a first backside power rail by subtractive metal etch, where the first backside power rail is directly below and connected to a source-drain epitaxy region of a positive field effect transistor (p-FET) region and forming a second backside power rail by damascene process, where the second backside power rail is directly below and connected to a source-drain epitaxy region of a negative field effect transistor (n-FET) region, where vertical side surfaces of the first backside power rail are tapered and a width of an upper horizontal surface of the first backside power rail is greater than a width of a lower horizontal surface of the first backside power rail, where vertical side surfaces of the second backside power rail are tapered and a width of an upper horizontal surface of the second backside power rail is less than a width of a lower horizontal surface of the second backside power rail, where the first backside power rail and the second backside power rail each include vertical side surfaces which taper in an opposite direction from each other.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 3 and 4 are parallel to each other, and FIG. 2 is perpendicular to FIGS. 3 and 4, according to an embodiment;

Figure 1:
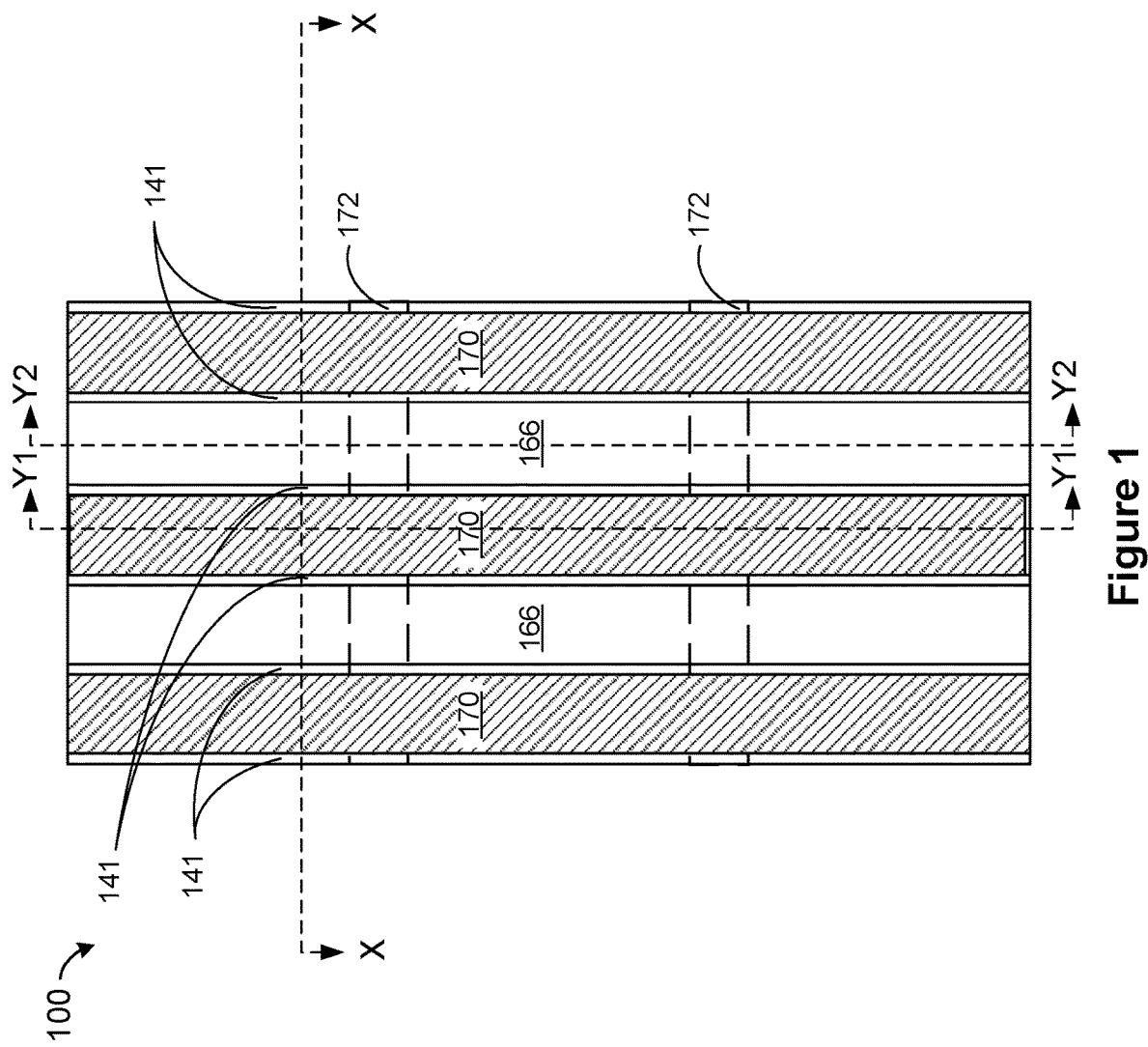
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to forming backside power rails with tight n-type field effect transistor (hereinafter "FET") to p-type FET spacing.

As demands to reduce the dimensions of transistor devices continue, possible N2P (n-type FET to p-type FET) shorts in a backside power rail become a concern. When N2P space is large, for example greater than 40 nm, forming backside metal 1 (M1), for example Vss and Vdd power rails, is not a concern for shorts. When the N2P space is scaled, for example less than 15 nm spacing between n-FET source drain and p-FET source drain, forming backside M1 is a concern for shorts due to close spacing between Vss and Vdd power rails.

This invention provides a structure and method to reduce shorts in a backside power rail by forming backside contact wiring to source drain epitaxy of each a negative field effect transistors (hereinafter "n-FET") and a positive field effect transistors (hereinafter "p-FET") in a stacked CMOS architecture, depositing a first metal, patterning the first metal for a first power rail for either an n-FET region or a p-FET region. This is referred to as subtractive patterning. Continuing, forming an isolation spacer around the first power rail, and then forming a second power rail for either the p-FET region or the n-FET region by damascene process. Damascene process is a conventional metallization process which trenches (or vias) are formed first in an interlayer dielectric (ILD) followed by metal deposition and CMP. A resulting structure includes a first backside power rail, for example, Vdd under the p-FET region, and a second backside power rail, for example, Vss under the n-FET region. One of the backside power rails is patterned by subtractive metal etch, and the other backside power rail is formed by damascene process. In an embodiment, the two neighboring backside power rails have opposite tapering angles. Specifically, the two neighboring backside power rails have tapered vertical side surfaces which taper in opposite directions from each other.

In an embodiment, there is a dielectric spacer between two neighboring backside power rails. The dielectric spacer may be between a p-FET region and an n-FET region. In an embodiment, there is a dielectric pillar between n-FET channel layers and p-FET channel layers.

An embodiment includes a semiconductor device including a first backside power rail directly below and connected to a source-drain epitaxy region of a positive field effect transistor (p-FET) region, and a second backside power rail directly below and connected to a source-drain epitaxy region of a negative field effect transistor (n-FET) region, where vertical side surfaces of the first backside power rail are tapered and a width of an upper horizontal surface of the first backside power rail is greater than a width of a lower horizontal surface of the first backside power rail, where vertical side surfaces of the second backside power rail are tapered and a width of an upper horizontal surface of the second backside power rail is less than a width of a lower horizontal surface of the second backside power rail, where the first backside power rail and the second backside power rail each include vertical side surfaces which taper in an opposite direction from each other.

The embodiment, further including a high-k dielectric spacer between the first backside power rail and the second backside power rail, wherein the high-k spacer includes a k value of greater than 5. An embodiment where the high-k dielectric spacer is between the n-FET region and the p-FET region.

The embodiment, further including where the p-FET region including semiconductor channel layers vertically aligned and stacked one on top of another, the semiconductor channel layers separated from each other by a gate stack material wrapping around the semiconductor channel layers, and the n-FET region including semiconductor channel layers vertically aligned and stacked one on top of another, the semiconductor channel layers separated from each other by a gate stack material wrapping around the semiconductor channel layers.

The embodiment, further including a gate cut dielectric between the adjacent stacks of semiconductor channel layers within the p-FET region.

The embodiment, further including a dielectric pillar between the p-FET region and the n-FET region. An embodiment including where the dielectric pillar extends vertically into a substrate of the semiconductor device.

An embodiment includes forming a first backside power rail by subtractive metal etch, where the first backside power rail is directly below and connected to a source-drain epitaxy region of a positive field effect transistor (p-FET) region, and forming a second backside power rail by damascene process, wherein the second backside power rail is directly below and connected to a source-drain epitaxy region of a negative field effect transistor (n-FET) region, where vertical side surfaces of the first backside power rail are tapered and a width of an upper horizontal surface of the first backside power rail is greater than a width of a lower horizontal surface of the first backside power rail, where vertical side surfaces of the second backside power rail are tapered and a width of an upper horizontal surface of the second backside power rail is less than a width of a lower horizontal surface of the second backside power rail, where the first backside power rail and the second backside power rail each include vertical side surfaces which taper in an opposite direction from each other.

The embodiment, further including forming a high-k dielectric spacer between the first backside power rail and the second backside power rail, where the high-k spacer includes a k value of greater than 7. An embodiment further including, the high-k dielectric spacer is between the n-FET region and the p-FET region.

The embodiment, further including forming a dielectric pillar between the p-FET region and the n-FET region, where the dielectric pillar extends vertically into a substrate of the semiconductor device.

The embodiment, further including forming the p-FET region by forming a first stack of nanosheet layers on a substrate including alternating layers of a sacrificial and a semiconductor channel vertically aligned and stacked one on top of another and forming the n-FET region by forming a second stack of nanosheet layers on the substrate including alternating layers of a sacrificial and a semiconductor channel vertically aligned and stacked one on top of another.

The embodiment, further including forming a gate cut dielectric between the adjacent stacks of semiconductor channel layers within the p-FET region.

Embodiments of the present invention disclose a structure and a method of forming a backside power rail with tight n-type field effect transistor (hereinafter "FET") to p-type FET spacing.

Figure 2:
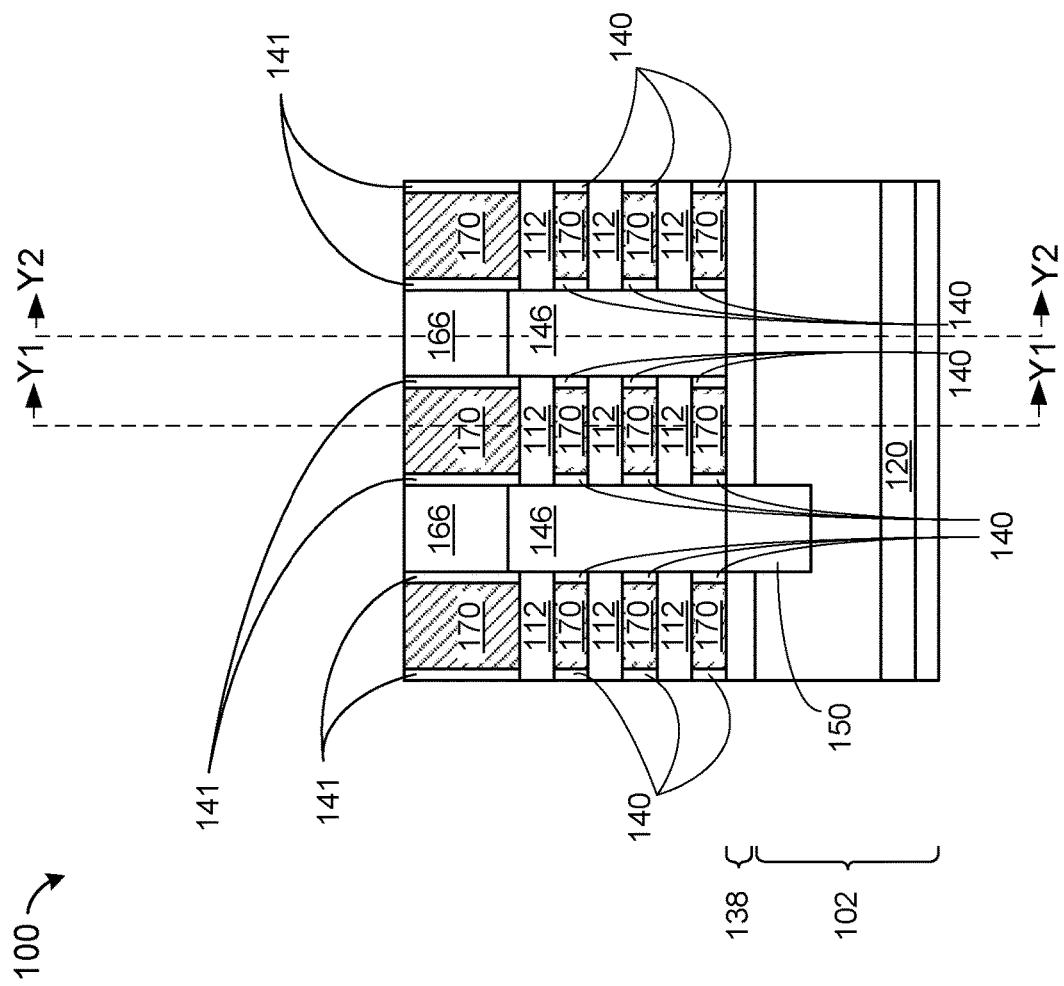
FIGS. 2, 3 and 4 each illustrate a cross-sectional view of the semiconductor structure of FIG. 1 along section lines X-X, Y1-Y1 and Y2-Y2, respectively.
Figure 3:
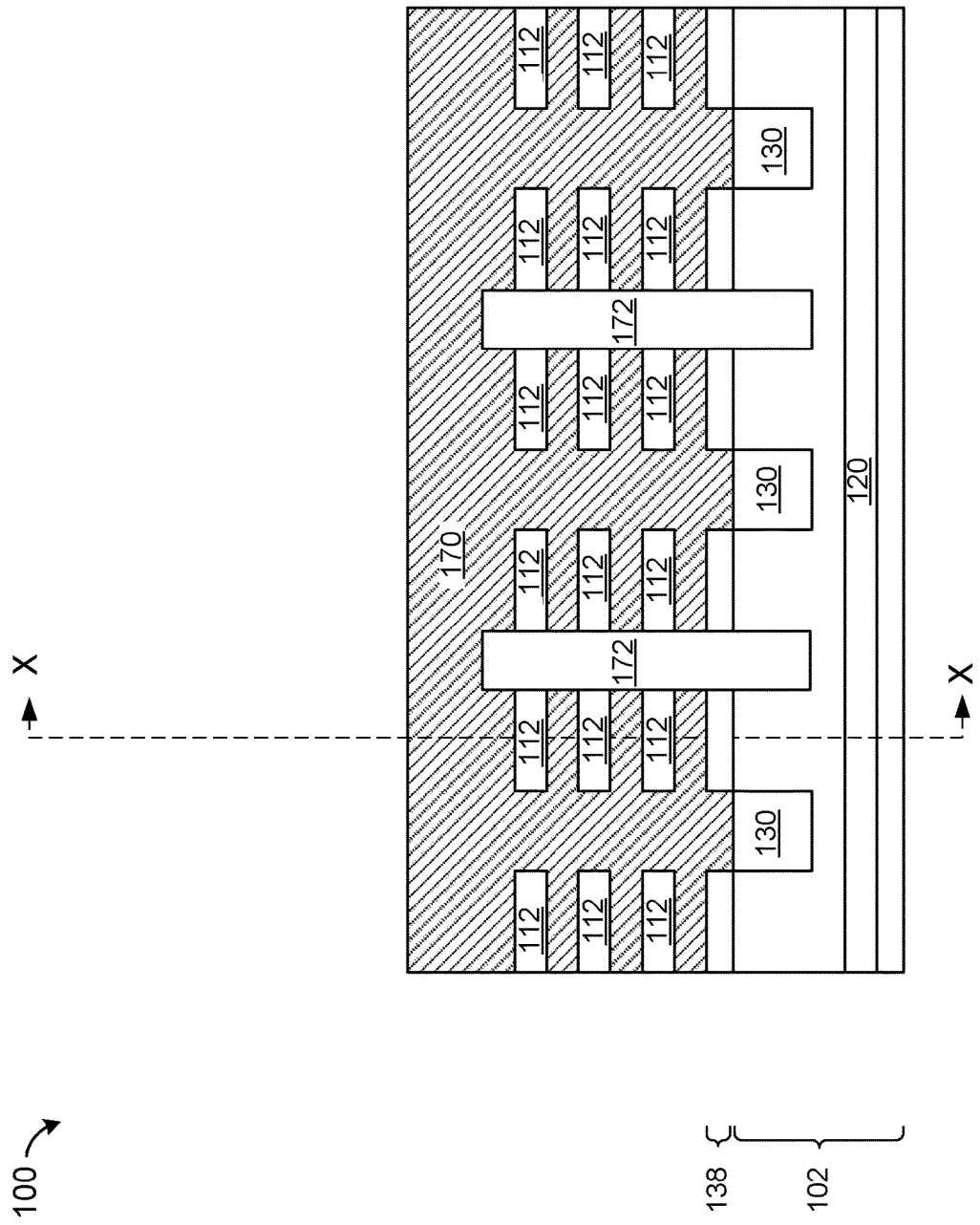
Figure 4:
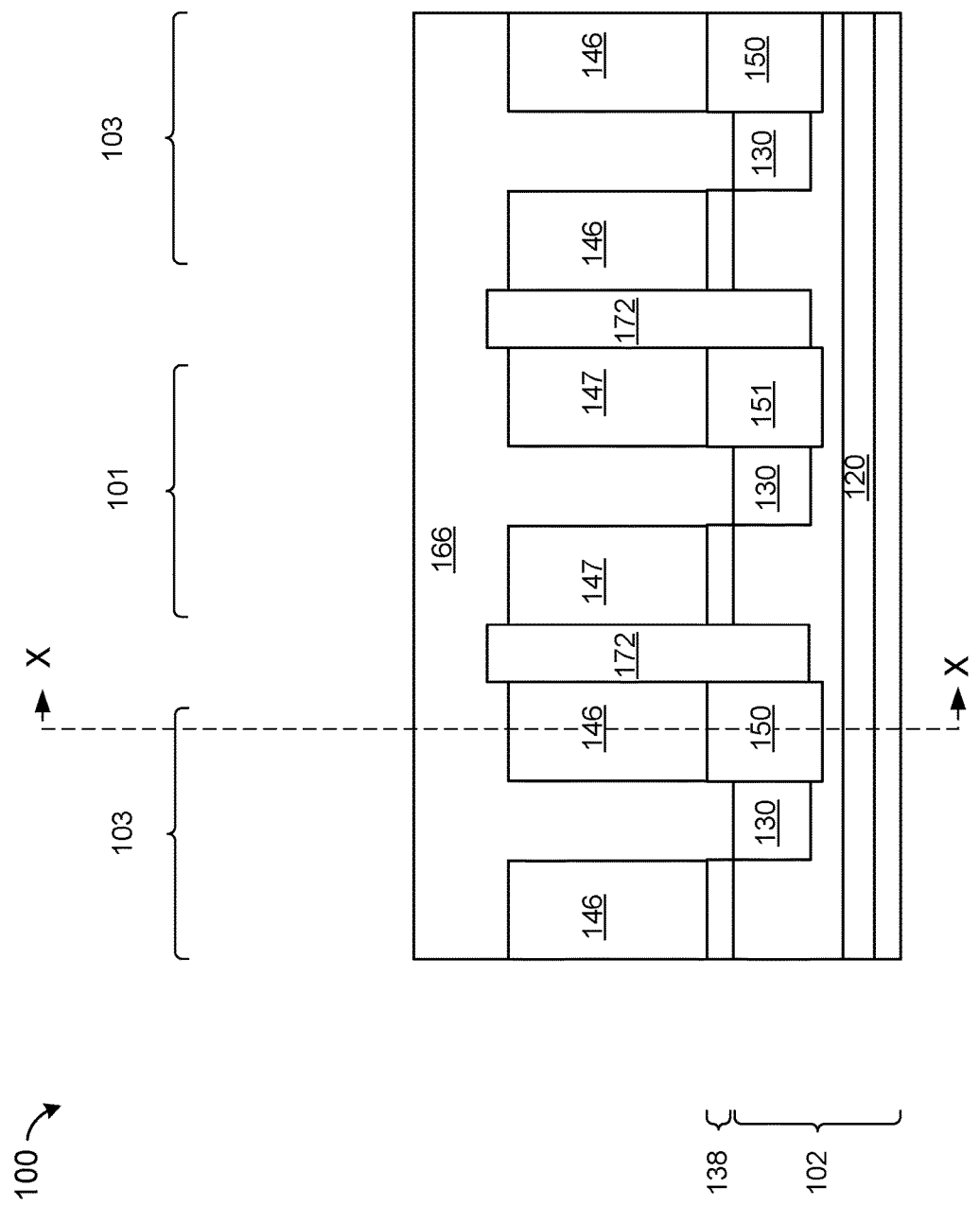

Referring now to FIGS. 1, 2, 3 and 4, a semiconductor structure 100 (hereinafter "structure") at an intermediate stage of fabrication is shown according to an exemplary embodiment. FIG. 1 is a top view of the structure 100. FIGS. 2, 3 and 4 are each a cross-sectional view of the structure 100 along section lines X-X, Y1-Y1 and Y2-2, respectively. FIGS. 3 and 4 are parallel to each other, and FIG. 2 is perpendicular to FIGS. 3 and 4. The structure 100 may be formed or provided.

Several steps have been completed to form the structure 100 of FIGS. 1, 2, 3. The structure 100 includes a substrate 102, an etch stop layer 120, channel layers 112, a shallow trench isolation region (hereinafter "STI") 130, inner spacers 140, gate side spacers 141, a bottom dielectric isolation (hereinafter "BDI") 138, a first sacrificial placeholder 150, a second sacrificial placeholder 151, an n-FET source drain 146, a p-FET source drain 147, an interlayer dielectric (hereinafter "ILD") 166, a replacement gate 170, and a dielectric pillar 172.

The dielectric pillar 172 may be formed between subsequently formed n-FET regions 103 and p-FET regions 101 of the structure 100 to isolate these regions from each other. The dielectric pillar 172 may have a width of about 8 to 20 nm and a height of 80 to 200 nm. The dielectric pillar 172 may be formed from the substrate 102 by removal of select portions of the substrate. The dielectric pillar 172 may have a lower horizontal surface below an upper horizontal surface of the substrate 102. The dielectric pillar 172 may have an upper horizontal above upper horizontal surfaces of subsequently formed n-FET source drain 146 and the p-FET source drain 147. There may be any number of p-FET nanosheet stacks between adjacent dielectric pillars 172 in the p-FET region 101. There may be any number of n-FET nanosheet stacks between adjacent dielectric pillars 172 in the n-FET region 103. An n-FET region is a region of the substrate with adjacent n-FET stacked nanosheet devices. A p-FET region is a region of the substrate with adjacent p-FET stacked nanosheet devices.

The structure 100 may have had alternating layers of sacrificial semiconductor material (not shown) and semiconductor channel material stacked one on top of another on the substrate 102. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer. The substrate 102 may have the etch stop layer 120 embedded in the substrate 102. The etch stop layer 120 may contain silicon germanium.

The alternating layers of sacrificial semiconductor material (not shown) and semiconductor channel material may have included a bottom sacrificial layer (not shown), covered by a sacrificial semiconductor material layer (hereinafter "sacrificial layer") (not shown), covered by a semiconductor channel material layer 112 (hereinafter "channel layer"), covered by a sacrificial layer (not shown), covered by a channel layer 112, covered by a sacrificial layer (not shown), covered by a channel layer 112. It should be noted that, while a limited number of alternating layers are depicted, any number of sacrificial layers (not shown), and channel layers 112 may be formed.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RTCVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer (not shown), is composed of a first semiconductor material which differs in composition from at least an upper portion of the substrate 102, the channel layer 112 and the bottom sacrificial layer (not shown). In an embodiment, each sacrificial layer (not shown), may be a silicon-germanium semiconductor alloy and have a germanium concentration less than 50 atomic percent. In another example, each sacrificial layer (not shown), may have a germanium concentration ranging from about 20 atomic percent to about 40 atomic percent. Each sacrificial layer (not shown) can be formed using known deposition techniques or an epitaxial growth technique as described above.

Each channel layer 112 is composed of a second semiconductor material which differs in composition from at least the upper portion of the substrate 102, the sacrificial layer (not shown) and the bottom sacrificial layer (not shown). Each channel layer 112 has a different etch rate than the first semiconductor material of sacrificial layer (not shown) and has a different etch rate than the bottom sacrificial layer (not shown). The second semiconductor material can be, for example, silicon. The second semiconductor material, for each channel layer 112 can be formed using known deposition techniques or an epitaxial growth technique as described above.

The bottom sacrificial layer (not shown) may be, for example, silicon germanium with a germanium concentration about 60 atomic percent, although percentages greater than 60 percent and less than 60 percent may be used. The bottom sacrificial layer (not shown) can be formed using an epitaxial growth technique. The bottom sacrificial layer (not shown) will subsequently be removed selective to the remaining alternating layers, as described below.

The alternating layers of sacrificial layer (not shown), channel layers 112 and the bottom sacrificial layer (not shown) can be formed by sequential epitaxial growth of alternating layers of the first semiconductor material, the second semiconductor material and the bottom sacrificial layer (not shown).

The sacrificial layers (not shown) may have a thickness ranging from about 5 nm to about 15 nm, and the channel layers 112 may have a thickness ranging from about 3 nm to about 15 nm. Each sacrificial layer (not shown) may have a thickness that is the same as, or different from, a thickness of each channel layer 112. In an embodiment, each sacrificial layer (not shown) has an identical thickness. In an embodiment, each channel layer 112 has an identical thickness.

The alternating layers of sacrificial layers (not shown), channel layers 112 and the bottom sacrificial layer (not shown) may be formed into nanosheet fins, by methods known in the arts and include steps such as forming a hard mask (not shown) on the alternating layers, patterning the hard mask (not shown). The hard mask (not shown) may be removed. The STI 130 may be formed between nanosheet fins after removal of a portion of the substrate 102.

The sacrificial gate (not shown) is formed orthogonal (perpendicular) to the nanosheet stacks. The sacrificial gate (not shown) may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate (not shown) can include any material including, for example, polysilicon, amorphous silicon, or multilayered combinations thereof. The sacrificial gate (not shown) can be formed using any deposition technique including, for example, chemical vapor deposition (CVD), physical vapor deposition (PVD), high density plasma (HDP) deposition, and spin on techniques. Optionally, a gate dielectric layer (not shown) and a gate cap (not shown) may be formed as part of the sacrificial gate (not shown) in accordance with known techniques.

In an embodiment, the sacrificial gate (not shown) is deposited with a thickness sufficient to fill, or substantially fill, the spaces between adjacent nanosheet structures and cover horizontal upper surfaces of the substrate 102 and the STI 130. The sacrificial gate (not shown) may be adjacent to vertical side surfaces of the nanosheet stack. The sacrificial gate (not shown) and surrounding gate side spacers 141 may cover an upper horizontal surface of an uppermost channel layer 112 of the nanosheet stack. A height of the sacrificial gate (not shown) may be much thicker than the underlying structure and may have a height between 100 nm and 150 nm about the nanosheet stack. A gate cap (not shown) may cover an upper horizontal surface and a vertical side surface of the sacrificial gate (not shown).

The bottom sacrificial layer (not shown) may be selectively removed using one or more known techniques selective to the channel layers 112, the sacrificial layers (not shown), the sacrificial gate (not shown), the gate side spacers 141 and the substrate 102. For example, a dry etching technique can be used to selectively remove the bottom sacrificial layer (not shown), such as, for example, using vapor phased HCl dry etch.

An insulator layer may be formed where the bottom sacrificial layer bottom sacrificial layer (not shown) was removed. The insulator layer may be formed after several processes, including for example, conformally depositing or growing a dielectric and performing an anisotropic etch back process. The insulator layer may include any dielectric material such as silicon nitride (SiN), silicon boron carbon nitride (SiBCN), silicon oxide carbon nitride (SiOCN), SiOC, SiC or aluminum oxide (AlOx), and may include a single layer or may include multiple layers of dielectric material. The insulator layer may have a thickness ranging from about 3 nm to about 15 nm. This process will form the gate side spacers 141 and the BDI 138. In an embodiment, the gate side spacers 141 and the BDI 138 may be formed simultaneously. In an alternate embodiment, the gate side spacers 141 and the BDI 138 may be formed individually.

The gate side spacers 141 may be formed vertically aligned with the sacrificial gate (not shown). The BDI 138 may be formed where the bottom sacrificial layer (not shown) was removed. The gate side spacers 141 may have a vertical side surface aligned with vertical side surfaces of the channel layers 112 and of the channel layers (not shown). The gate side spacers 141 may have a vertical side surface adjacent to a vertical side surface of the sacrificial gate (not shown).

Portions of the sacrificial layers (not shown) may be selectively removed using known techniques. For example, a wet or dry etch process can be used with the appropriate chemistry to remove portions of each of the sacrificial layers (not shown). The material used for the etching process may be selective such that the channel layers 112, the sacrificial gate (not shown), the gate side spacers 141, the BDI 138, the dielectric pillar 172, the STI 130 and the substrate 102 remain and are not etched. After etching, portions of the sacrificial layers (not shown) covered on opposite sides by the sacrificial gate (not shown) may remain as part of the nanosheet stack. In such cases, the sacrificial gate (not shown) supports the remaining channel layers 112 of the nanosheet stack.

The inner spacer 140 may be formed where the portions of the sacrificial layers (not shown) have been removed. The inner spacer 140 may be formed by conformally depositing or growing a dielectric material, followed by a combination of dry and wet isotropic etch back steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch back process such as a reactive ion etch (RIE) and/or wet etch process, or any suitable etch process. In an embodiment, the inner spacer 140 may include one or more layers. In an embodiment, the inner spacer 140 may include any dielectric material such as silicon oxide, silicon oxynitride, silicon nitride, SiBCN, SiOC, low-k dielectric or any combination of these materials. In an embodiment, the inner spacer 140 may be nitride. In an alternate embodiment, the inner spacer 140 may be oxide.

The inner spacer 140 may completely fill in spaces between the channel layers 112, between the upper most channel layer 112 and the sacrificial gate 126, and between the lowermost channel layer 112 and the BDI 138, where the portions of the sacrificial layers (not shown) had been previously removed. A vertical side surface of the inner spacer 140 may be aligned with a vertical side surface of the channel layers 112 and a vertical side surface of the gate side spacer 141.

A source drain trench (not shown) may be formed by an anisotropic etching technique, such as, for example, reactive ion etching (RIE). A lowermost surface of the source drain trench (not shown) may reach to an upper horizontal surface of the substrate 102 and the STI 130. The anisotropic etching may remove aligned vertical portions of the stacked nanosheet fin between adjacent sacrificial gates (not shown) and gate side spacers 141. The sacrificial gate (not shown) and the gate side spacers 141 may protect remaining portions of the nanosheet stack.

A sacrificial placeholder trench (not shown) may be formed by an anisotropic etching technique, such as, for example, reactive ion etching (RIE). The sacrificial placeholder trench (not shown) may be formed below the source drain trench (not shown) in select positions in the substrate 102.

The first sacrificial placeholder 150 may be formed in the sacrificial placeholder trench (not shown) of the n-FET region. The second sacrificial placeholder 151 may be formed in the sacrificial placeholder trench (not shown) of the p-FET region.

The material of the first sacrificial placeholder 150 and the second sacrificial placeholder 151 may include SiGe, III-V semiconductor, TiOx, AlOx, SiC, etc. The first sacrificial placeholder 150 and the second sacrificial placeholder 151 may be formed by bottom-up epitaxy growth, or deposition process followed by CMP and recess.

The n-FET source drain 146 and the p-FET source drain 147 may each be grown separately by methods known in the arts. For example, the source drain trench may be first formed where the n-FET source drain 146 is to be formed, the n-FET source drain 146 may be formed, then a second source drain trench may be formed where the p-FET source drain 147 is to be formed.

The n-FET source drain 146 and the p-FET source drain 147 may each be epitaxially grown surrounding a vertical portion of the nanosheet stack on opposite sides of the sacrificial gate (not shown) in the source drain trench (not shown) on the STI 130 and the substrate 102. In this embodiment, the n-FET source drain 146 and the p-FET source drain 147 may each surround the channel layers 112 and the sacrificial layers (not shown) with surrounding inner spacers 140, in the n-FET region 103 and the p-FET region 101, respectively. An upper surface of the n-FET source drain 146 and an upper surface of the p-FET source drain 147 may be higher than an upper surface of an upper most channel layer 112. The n-FET source drain 146 may be formed on the first sacrificial placeholder 150. The p-FET source drain 147 may be formed on the second sacrificial placeholder 151.

A first vertical side surface of the dielectric pillar 172 may be adjacent to a vertical side surface of the n-FET source drain 146. A second vertical side surface of the dielectric pillar 172 may be adjacent to a vertical side surface of the p-FET source drain 147.

The ILD 166 may be formed by depositing or growing a dielectric material, followed by a combination of CMP and dry/wet etch and recessing steps on the n-FET source drain 146, the p-FET source drain 147, the dielectric pillar 172, and the STI 130. The ILD 166 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an etch process such as wet etch or a reactive ion etch (RIE), or any suitable etch process. In an embodiment, the ILD 166 may include one or more layers. In an embodiment, the ILD 166 may include any dielectric material such as silicon oxide, silicon oxynitride, silicon nitride, SiBCN, SiOC, low-k dielectric or any combination of these materials. In an embodiment, the ILD 166 may be a nitride. In an alternate embodiment, the ILD 166 may be an oxide. The ILD 166 may be formed on the n-FET source drain 146 and the p-FET source drain 147, adjacent to the gate side spacers 141.

The sacrificial gate (not shown) may be removed by methods known in the arts. The sacrificial layers (not shown) may be removed by methods known in the arts. The sacrificial gate (not shown) and the sacrificial layers (not shown) may be removed simultaneously or consecutively. The sacrificial gate (not shown) and the sacrificial layers (not shown) are removed selective to the channel layers 112, the inner spacers 140, the ILD 166, the BDI 138, the source drain 146, the gate side spacers 141, the first sacrificial placeholder 150, the second sacrificial placeholder 151, the STI 130, the dielectric pillar 172 and the substrate 102. For example, a dry etch process can be used to selectively remove the sacrificial gate (not shown) and the sacrificial layers (not shown), such as using vapor phased HCl dry etch. An upper surface and a lower surface of the channel layers 112 may be exposed. An upper surface of the BDI 138 may be exposed. Vertical side surfaces of the gate side spacer 141 and the inner spacers 140 may be exposed.

The replacement gate 170 may be conformally formed on the structure 100, according to an exemplary embodiment. The replacement gate 170 is formed in each cavity of the nanosheet stack and surrounding suspended portions of the channel layers 112. The replacement gate 170 forms a layer surrounding exposed portions of the nanosheet stacks. The replacement gate 170 may cover an exposed upper horizontal surface of the BDI 138, exposed vertical side surfaces of one side of each of the side spacers 140, and exposed vertical surfaced of one side of the gate side spacers 141. The replacement gate 170 may cover vertical side surfaces, an upper horizontal surface and a lower horizontal surface of the channel layers 110.

The replacement gate 170 may be deposited using typical deposition techniques, for example, atomic layer deposition (ALD), molecular layer deposition (MLD), and chemical vapor deposition (CVD). In an embodiment, the replacement gate 170 may include more than one layer, for example, a conformal layer of a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. In an embodiment, a work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

In an embodiment, the replacement gate 170 of the nanosheet stack of the n-FET region 103 may include a different material than the replacement gate 170 of the p-FET nanosheet region 101.

A chemical mechanical polishing (CMP) technique may be used to remove excess material and polish upper surfaces of the structure 100. An upper surface of the structure 100 may include horizontal surfaces of the ILD 166, the gate side spacers 141 and the replacement gate 170.

There is one p-FET region 101 and two n-FET regions 103 shown in FIG. 4. There may be any number of p-FET regions 101 and n-FET regions 103 on the structure 100.

Figure 5:
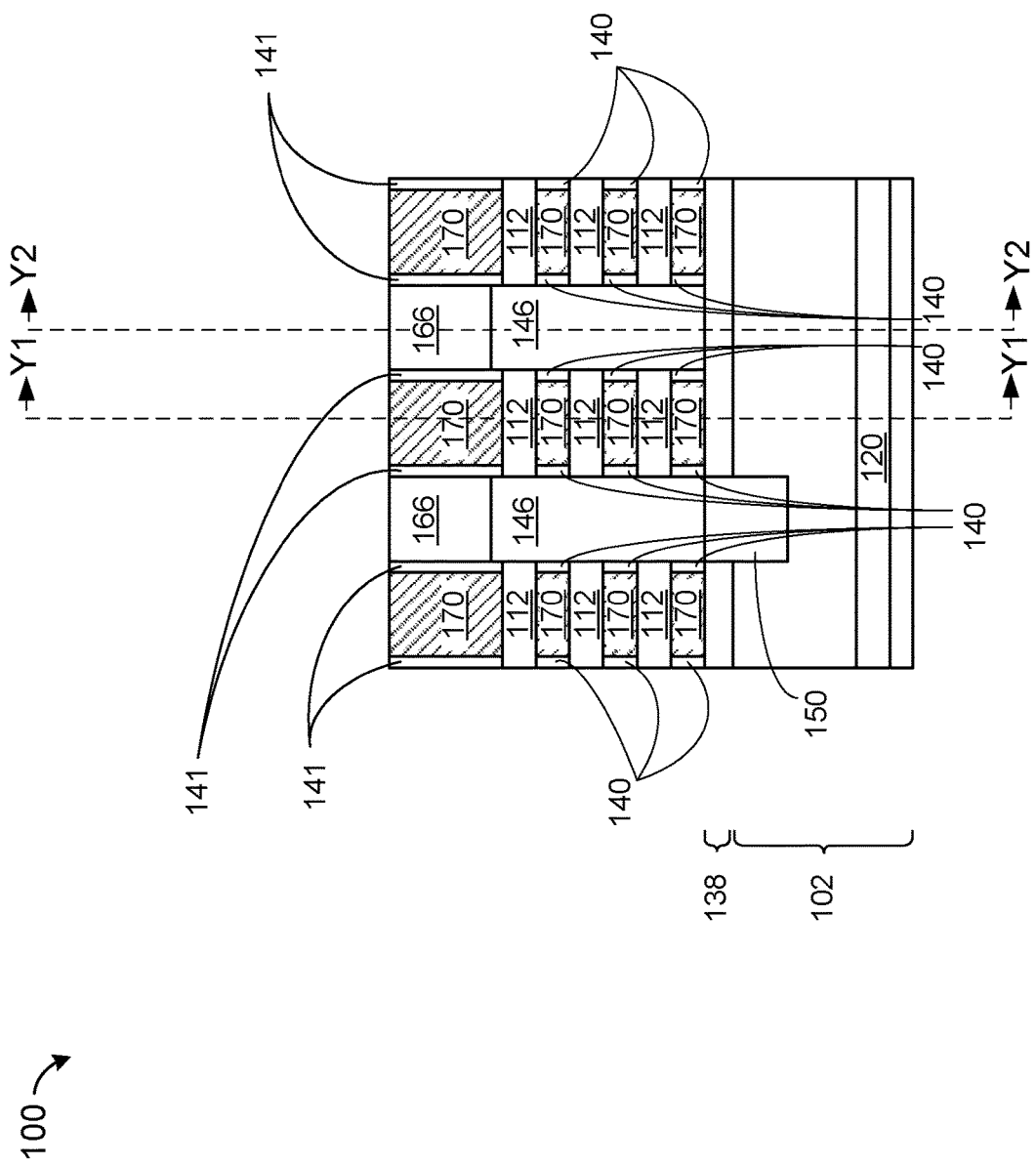
FIGS. 5, 6 and 7 each illustrate a cross-sectional view of the semiconductor structure along section lines X-X, Y1-Y1 and Y2-Y2, respectively, and illustrate forming a late gate cut, according to an embodiment.
Figure 6:
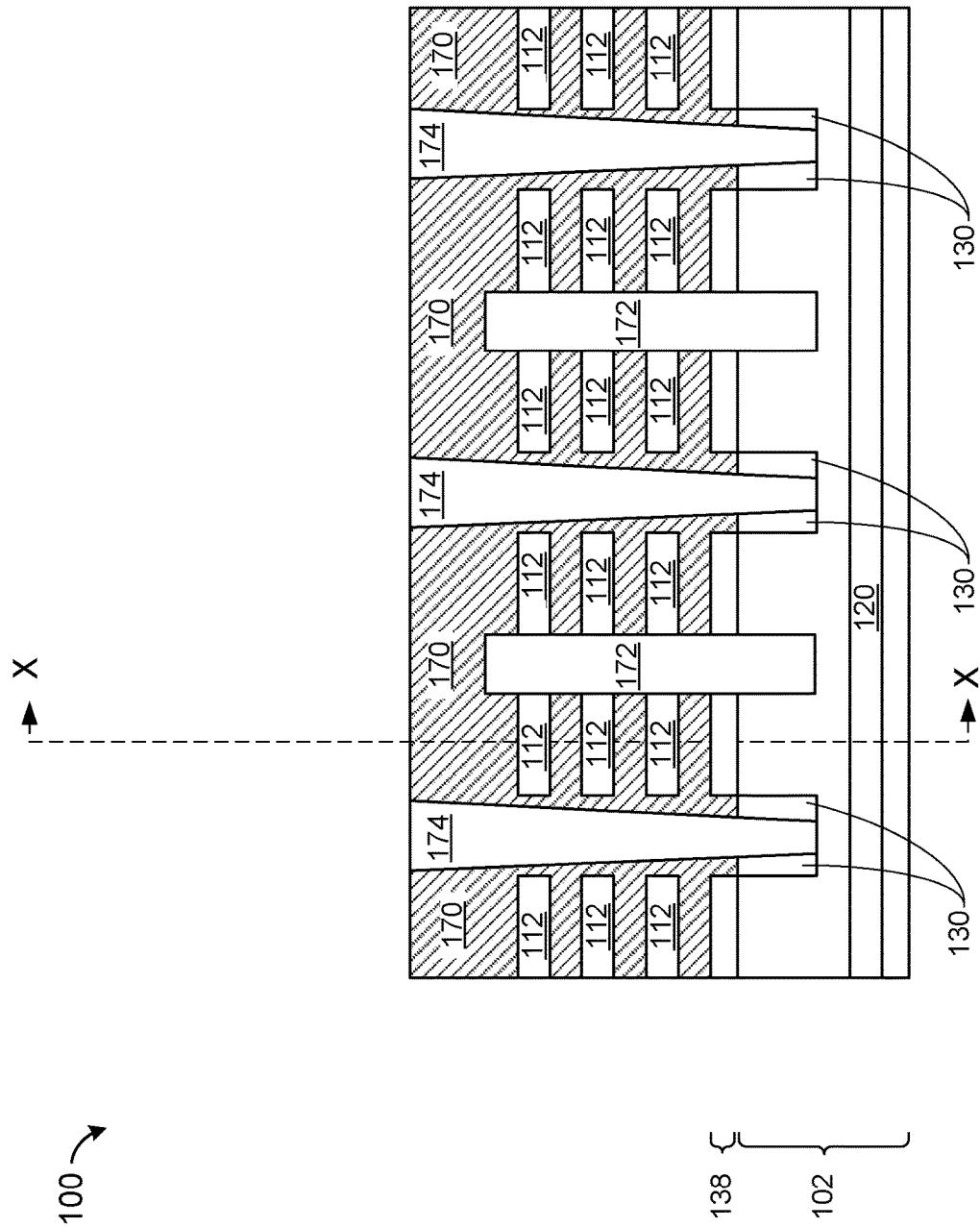
Figure 7:
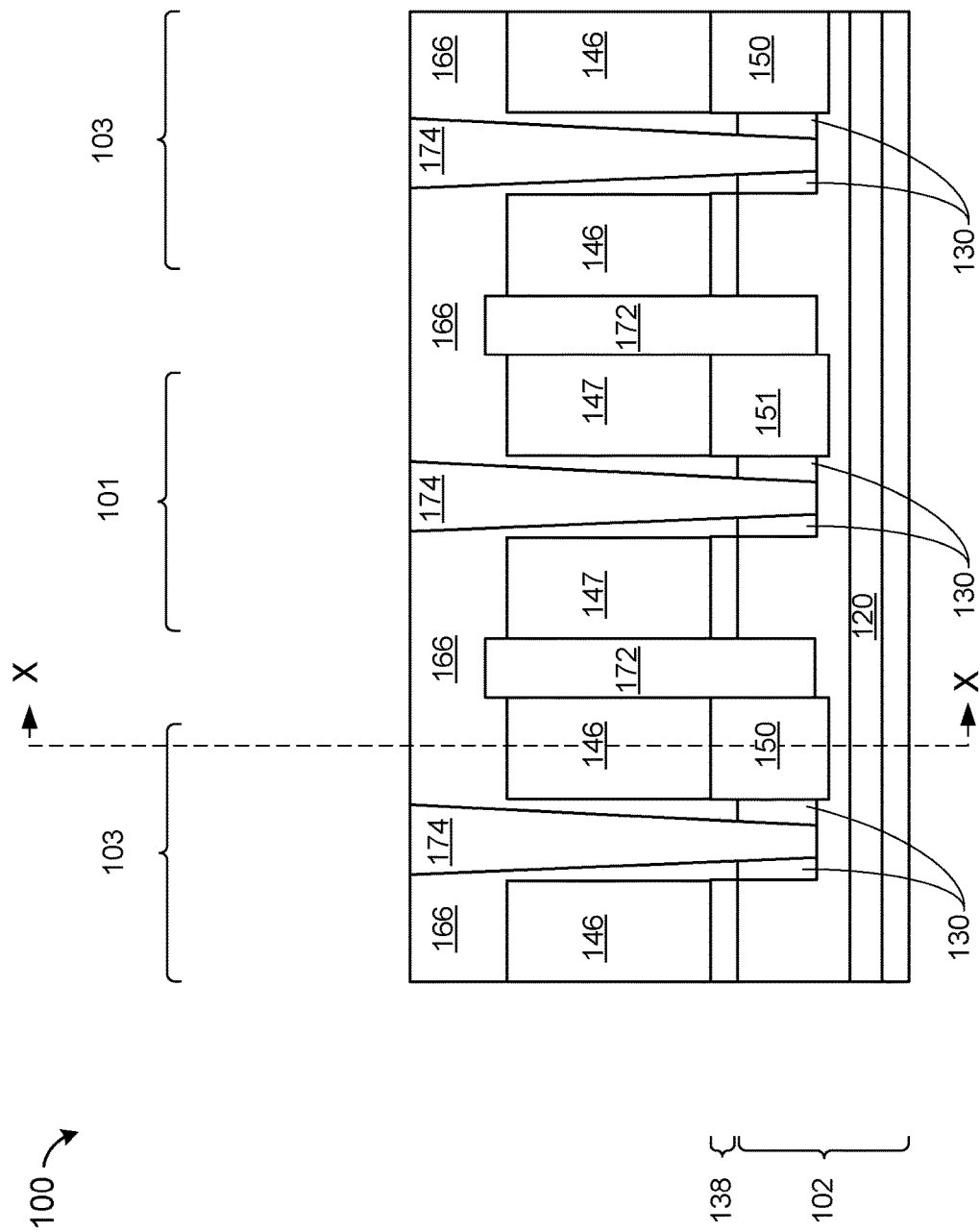

Referring now to FIGS. 5, 6 and 7, the structure 100 is shown according to an exemplary embodiment. FIGS. 5, 6 and 7 are each a cross-sectional view of the structure 100 along section lines X-X, Y1-Y1 and Y2-2, respectively. FIGS. 6 and 7 are parallel to each other, and FIG. 5 is perpendicular to FIGS. 6 and 7. FIG. 5 is the same as FIG. 2. A gate cut dielectric 174 may be formed.

A gate cut opening (not shown) may be formed using methods known in the arts. For example, a lithograph patterning and dry etch technique may be used to selectively remove vertically aligned portions of the STI 130, the replacement gate 170 and the ILD 166. The gate cut opening (not shown) may be formed parallel to the section X-X. The gate cut opening (not shown) may be between adjacent source drains 147, and may be between adjacent source drains 146. The gate cut opening (not shown) may be between adjacent nanosheet stacks.

The gate cut dielectric 174 may be formed in the gate cut opening (not shown). The gate cut dielectric 174 may be formed by conformally depositing or growing a dielectric material, filling the gate cut opening (not shown). The gate cut dielectric 174 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the gate cut dielectric 174 may include one or more layers. In an embodiment, the gate cut dielectric 174 may include any dielectric material such as silicon oxide, silicon oxynitride, silicon nitride, SiBCN, SiOC, low-k dielectric or any combination of these materials. A lower surface of the gate cut dielectric 174 may be adjacent to an upper surface of the substrate 102. A vertical side surface of the first dielectric 174 may be adjacent to vertical side surfaces of the STI 130, the replacement gate 170 and the ILD 166.

A chemical mechanical polishing (CMP) technique may be used to remove excess material and polish upper surfaces of the structure 100. An upper surface of the structure 100 may include horizontal surfaces of the ILD 166, the gate side spacers 141, the replacement gate 170 and the gate cut dielectric 174.

Figure 8:
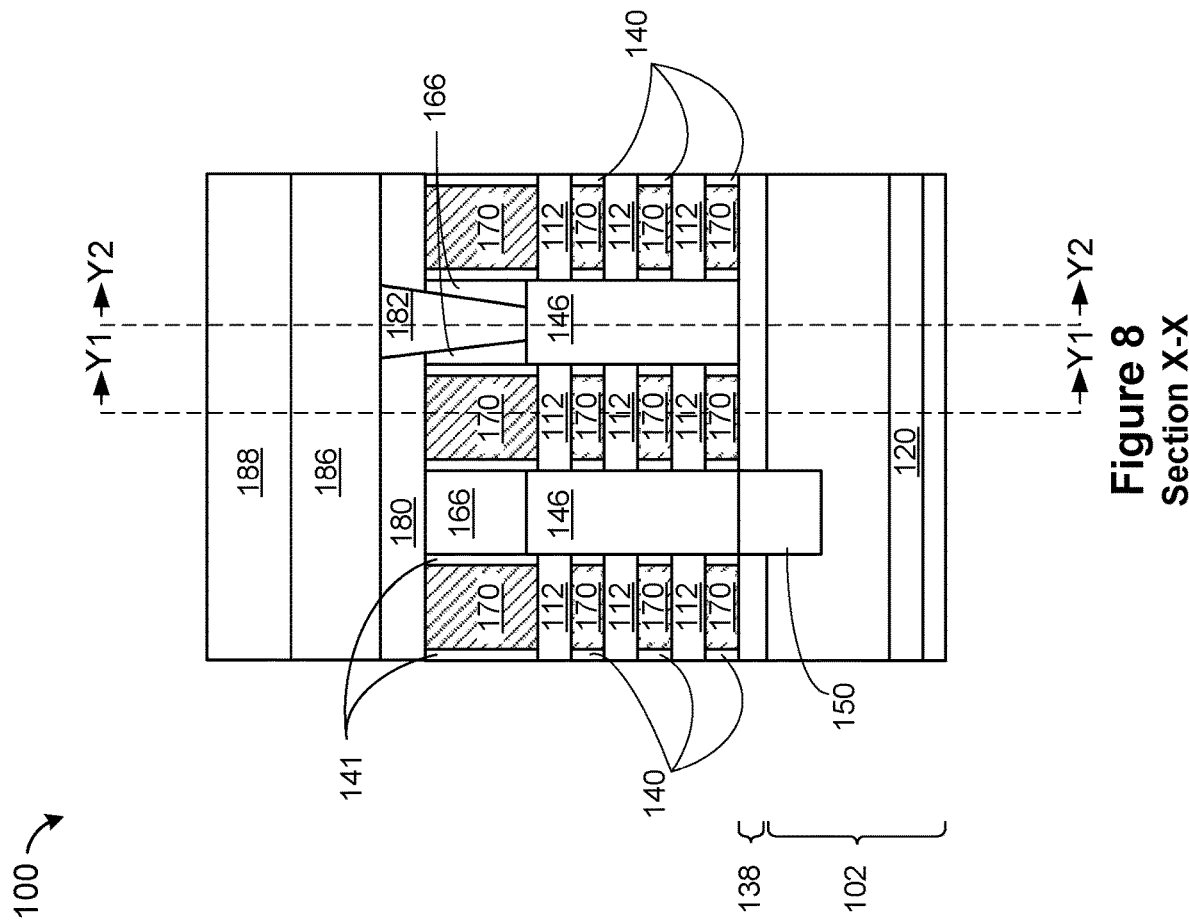
FIGS. 8, 9 and 10 each illustrate a cross-sectional view of the semiconductor structure of along section lines X-X, Y1-Y1 and Y2-Y2, respectively, and illustrate forming a middle of line contact, a back end of liner interconnect and bonding a carrier wafer to the structure, according to an embodiment.
Figure 9:
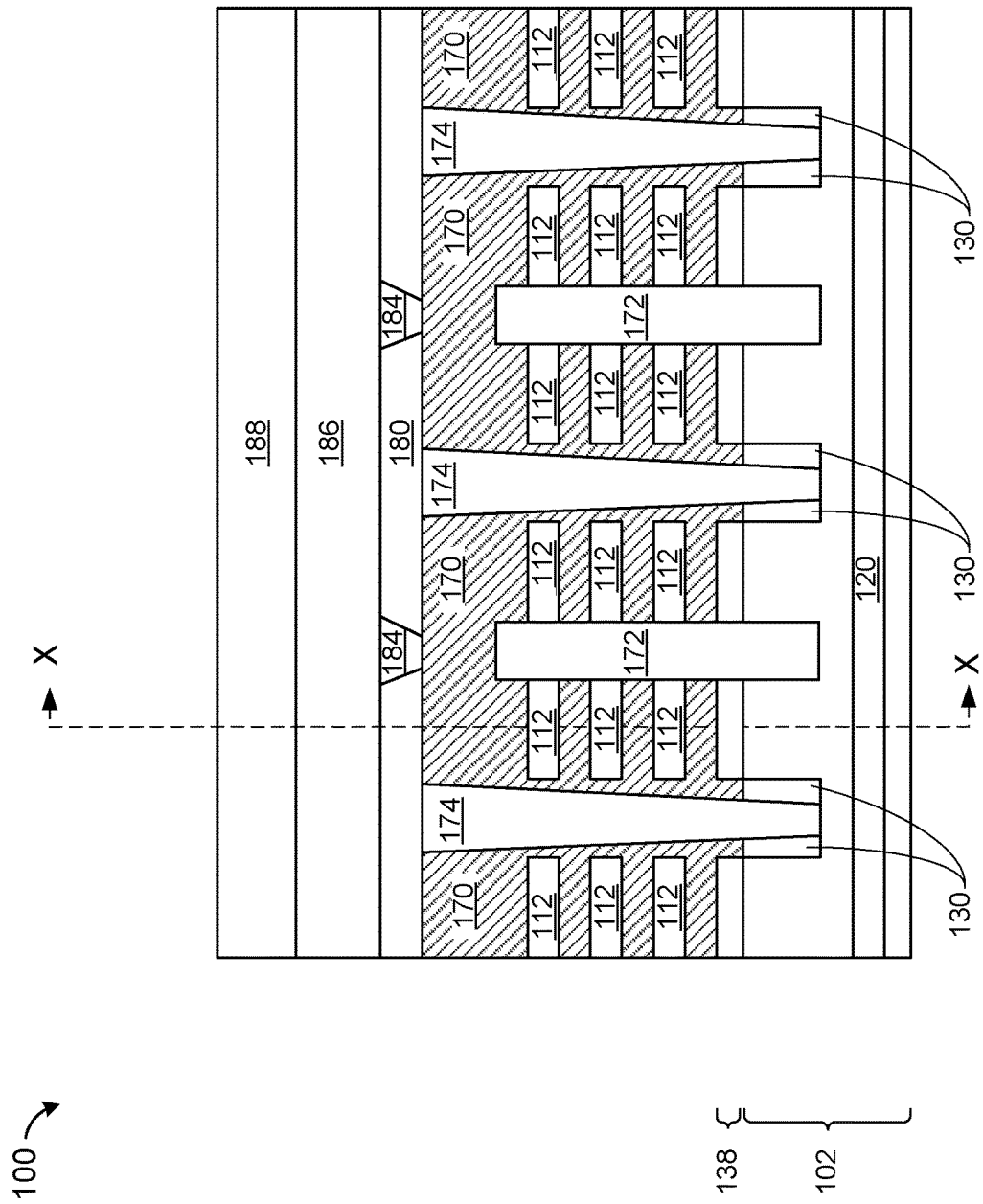
Figure 10:
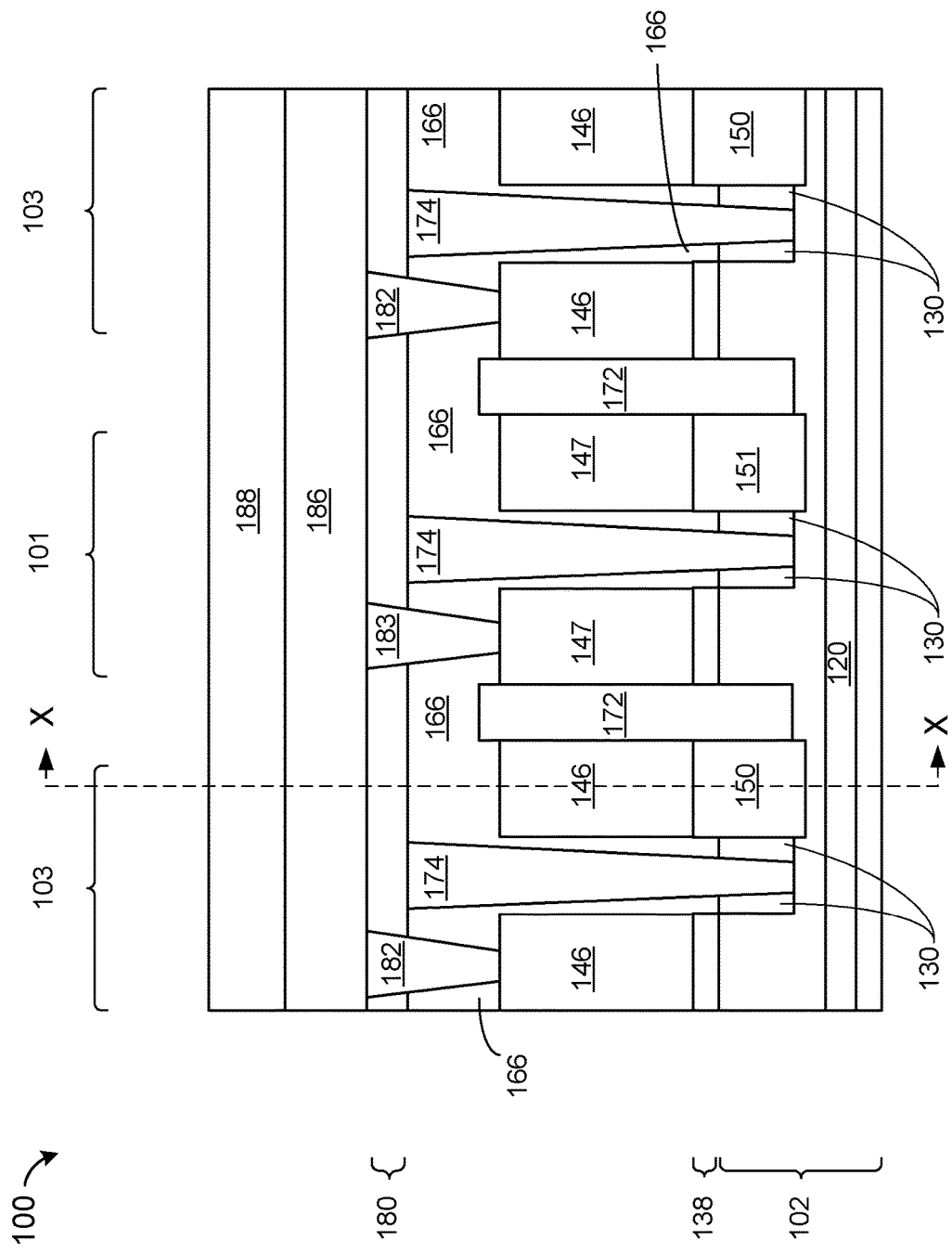

Referring now to FIGS. 8, 9 and 10, the structure 100 is shown according to an exemplary embodiment. FIGS. 8, 9 and 10 are each a cross-sectional view of the structure 100 along section lines X-X, Y1-Y1 and Y2-2, respectively. FIGS. 9 and 10 are parallel to each other, and FIG. 8 is perpendicular to FIGS. 9 and 10. An interlayer dielectric (hereinafter "ILD") 180 may be formed. Contacts 182, 183, 184 may be formed. A frontside interconnect layer 186 may be formed. A carrier wafer 188 may be mounted on the structure 100.

The ILD 180 may be formed as described for the ILD 166. A first contact opening (not shown) may be made in the structure 100 through the ILD 180 and the ILD 166 exposing an upper horizontal surface of the n-FET source drain 146. The contact 182 may be formed in the first contact opening (not shown) to form a contact to the n-FET source drain 146. The contact 182 may be formed to an n-FET source drain 146 which does not have a first sacrificial placeholder 150 below. An n-FET source drain 146 which does have a have a first sacrificial placeholder 150 below will have a backside contact formed at a later point of fabrication.

A second contact opening (not shown) may be made in the structure 100 through the ILD 180 and the ILD 166 exposing an upper horizontal surface of the p-FET source drain 147. The contact 183 may be formed in the second contact opening (not shown) to form a contact to the p-FET source drain 147. The contact 183 may be formed to an p-FET source drain 147 which does not have a second sacrificial placeholder 151 below. A p-FET source drain 147 which does have a have a second sacrificial placeholder 151 below will have a backside contact formed at a later point of fabrication.

A third contact opening (not shown) may be made in the structure 100 through the ILD 180 exposing an upper horizontal portion of the replacement gate 170. The contact 184 may be formed in the third contact opening (not shown) to form a contact to the replacement gate 170.

The contacts 182, 183, 184 may be formed by method known in the arts. The contacts 182, 183, 184 may have more than one layer. The contacts 182, 183, 184 may include a silicide liner such as Ti, Ni, NiPt, an adhesion liner, such as TiN and a conductive metal, such as W, Co, Ru, or Mo. A chemical mechanical polishing (CMP) technique may be used to remove excess material and polish upper surfaces of the structure 100, exposing an upper horizontal surface of the ILD 180 and upper horizontal surfaces of the contacts 182, 183, 184.

The frontside interconnect layer 186 may be formed on the ILD 180 and on the contacts 182, 183, 184. The frontside interconnect layer 186 may also be referred to as Back end of line (hereinafter "BEOL") layers. The frontside interconnect layer 186 may include layers of wiring and vias formed above the existing structure, above the contacts 182, 183, 184 and the ILD 180. In an embodiment, the frontside interconnect layer 186 may include 12 or more layers of metal lines and visas. The frontside interconnect layer 186 may be formed using known techniques.

The carrier wafer 188 may be attached to an upper surface of the structure 100, mounted on an upper surface of the frontside interconnect layer 186. The carrier wafer 188 may be attached using conventional wafer bonding process, such as dielectric-to-dielectric bonding or copper-to-copper bonding process.

Figure 11:
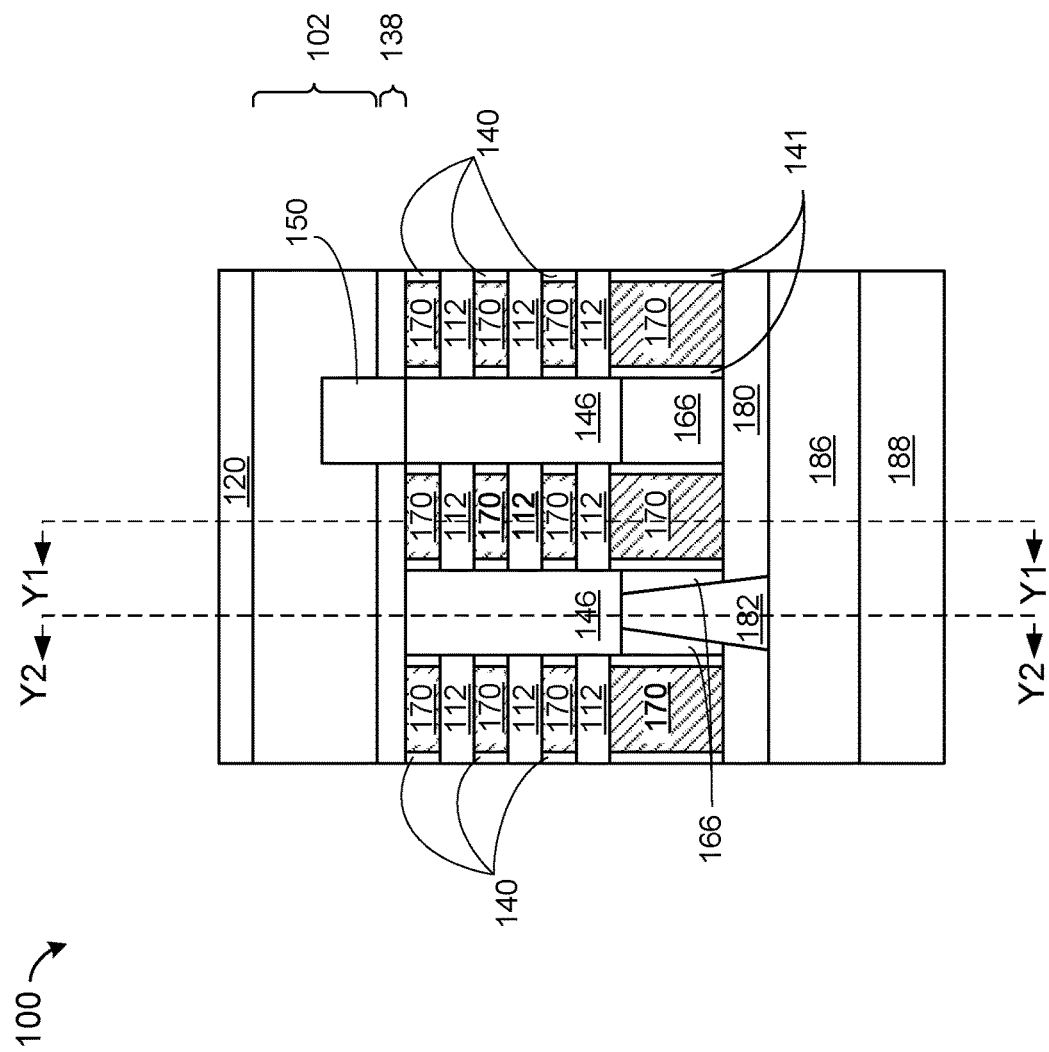
FIGS. 11, 12 and 13 each illustrate a cross-sectional view of the semiconductor structure of along section lines X-X, Y1-Y1 and Y2-Y2, respectively, and illustrate forming flipping the semiconductor structure upside down, and removal of portions of a wafer of the semiconductor structure, according to an embodiment.
Figure 12:
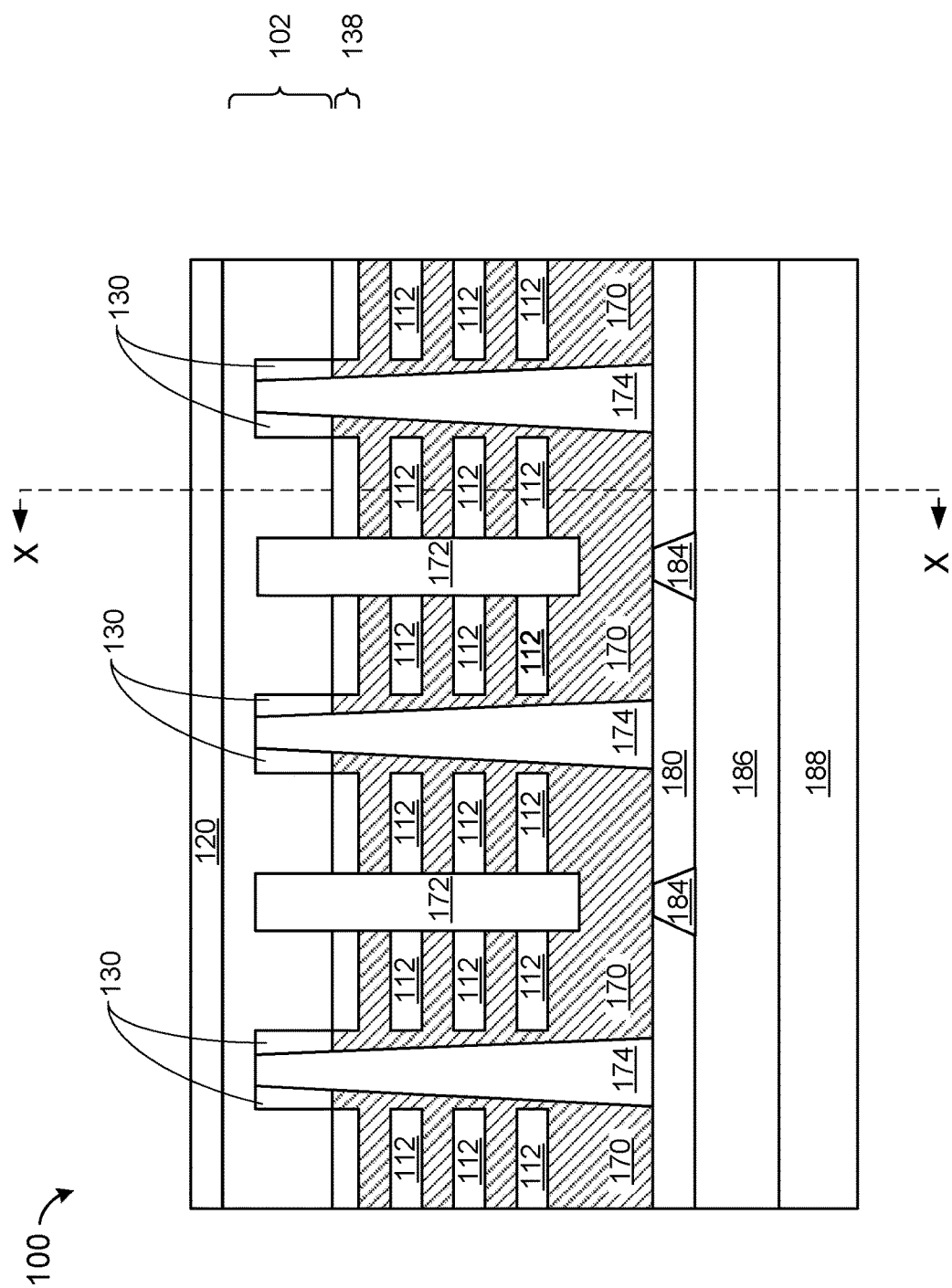
Figure 13:
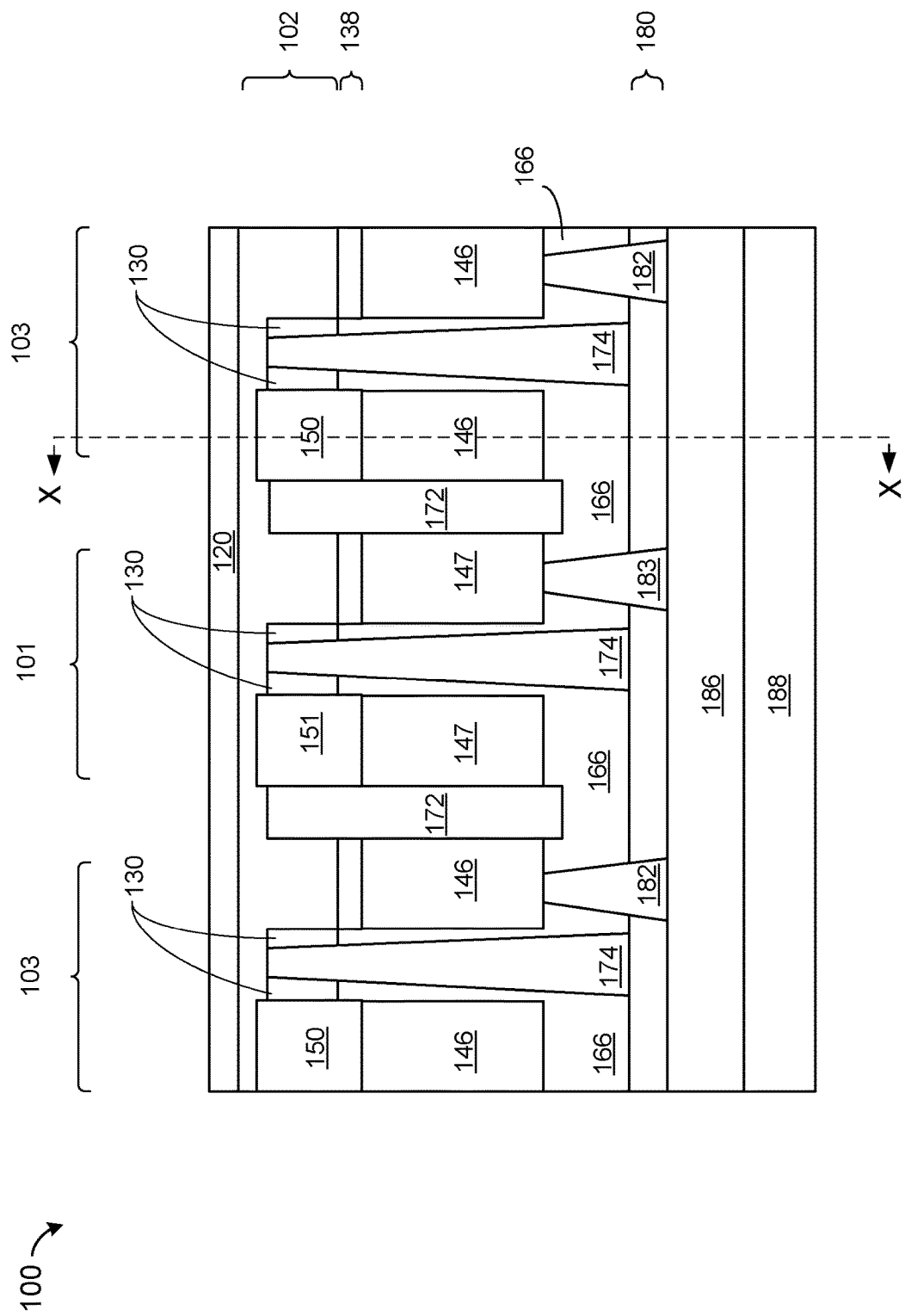

Referring now to FIGS. 11, 12 and 13, the structure 100 is shown according to an exemplary embodiment. FIGS. 11, 12 and 13 are each a cross-sectional view of the structure 100 along section lines X-X, Y1-Y1 and Y2-2, respectively. FIGS. 12 and 13 are parallel to each other, and FIG. 11 is perpendicular to FIGS. 12 and 13. The structure 100 may be flipped and portions of the silicon substrate 102 may be removed.

The structure 100 may be turned such that the carrier wafer 188 is now at a bottom, shown at a lowest point of the structure 100, and a lower surface of the silicon substrate 102 is now shown at a upper level of the structure for further processing.

Portions of the silicon substrate 102 may be selectively removed exposing a (now) upper surface of the etch stop layer 120 using a combination of processes steps, such as wafer grinding, CMP, RIE and wet etch process.

Figure 14:
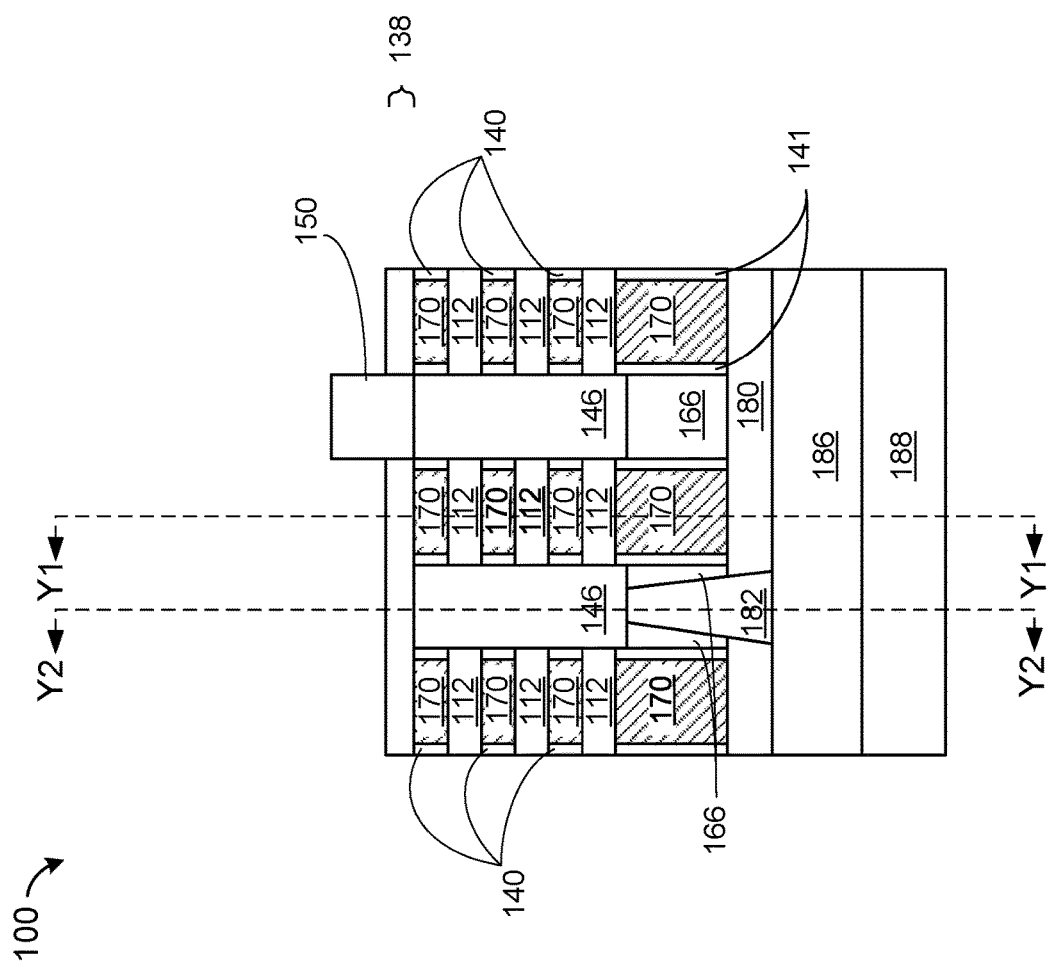
FIGS. 14, 15 and 16 each illustrate a cross-sectional view of the semiconductor structure of along section lines X-X, Y1-Y1 and Y2-Y2, respectively, and illustrate removal of remaining portions of the wafer of the semiconductor structure, according to an embodiment.
Figure 15:
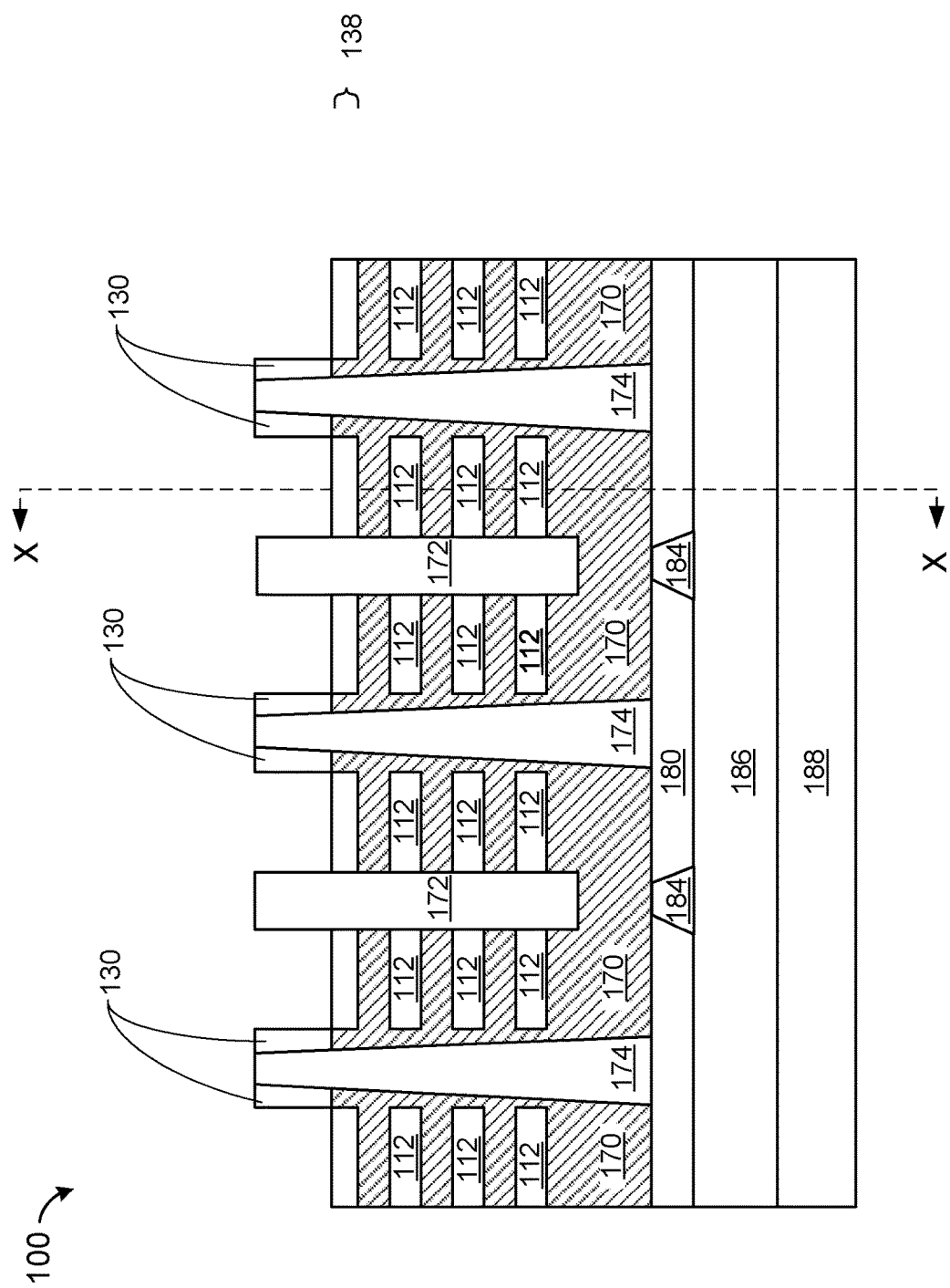
Figure 16:
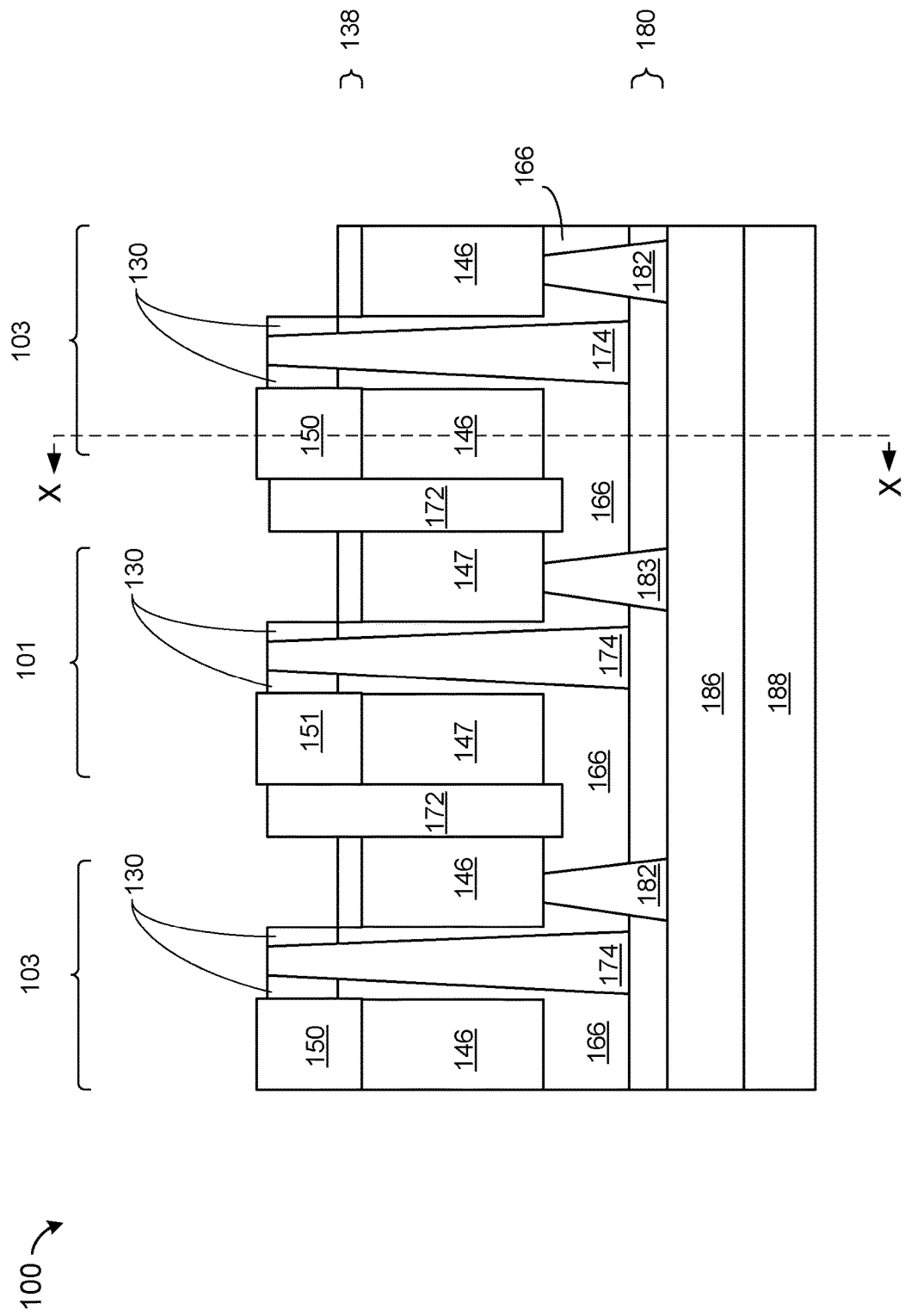

Referring now to FIGS. 14, 15 and 16, the structure 100 is shown according to an exemplary embodiment. FIGS. 14, 15 and 16 are each a cross-sectional view of the structure 100 along section lines X-X, Y1-Y1 and Y2-2, respectively. FIGS. 15 and 16 are parallel to each other, and FIG. 14 is perpendicular to FIGS. 15 and 16. The etch stop layer 120 and remaining portions of the substrate 102 may be removed.

Selective etching may be used to remove the etch stop layer 120 and remaining portions of the silicon substrate 102 to expose an upper surface of the BDI 138, an upper and side surfaces of each of the first and second sacrificial placeholders 150, 151, an upper surface of the gate cut dielectric 174, an upper surface and portions of a vertical side surface of the dielectric pillar 172, and upper and side surfaces of the STI 130. The material used for the etching process may be selective such that the BDI 138, the first, second sacrificial placeholders 150, 151, the gate cut dielectric 174, the dielectric pillar 172 and the STI 130 remain and are not etched.

Figure 17:
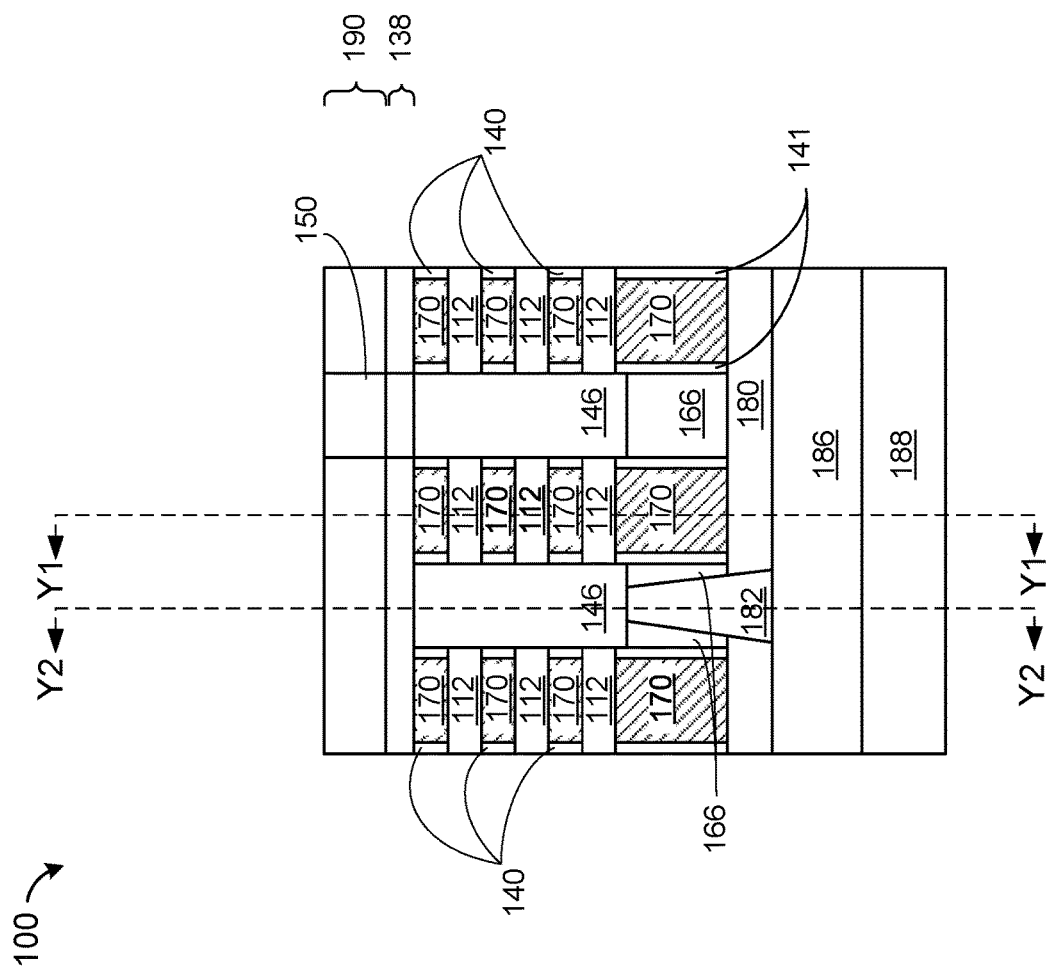
FIGS. 17, 18 and 19 each illustrate a cross-sectional view of the semiconductor structure of along section lines X-X, Y1-Y1 and Y2-Y2, respectively, and illustrate formation of an interlevel dielectric, according to an embodiment.
Figure 18:
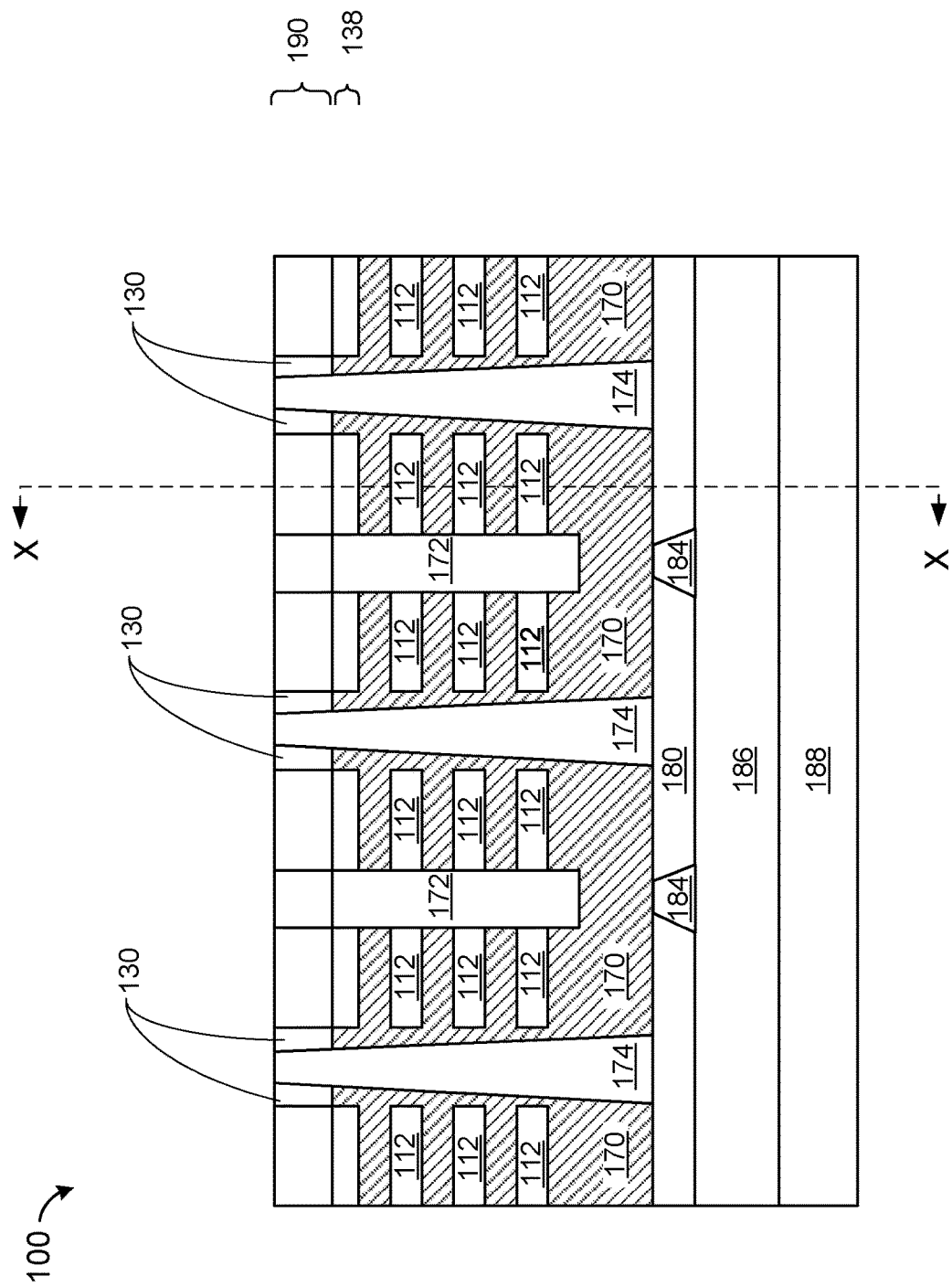
Figure 19:
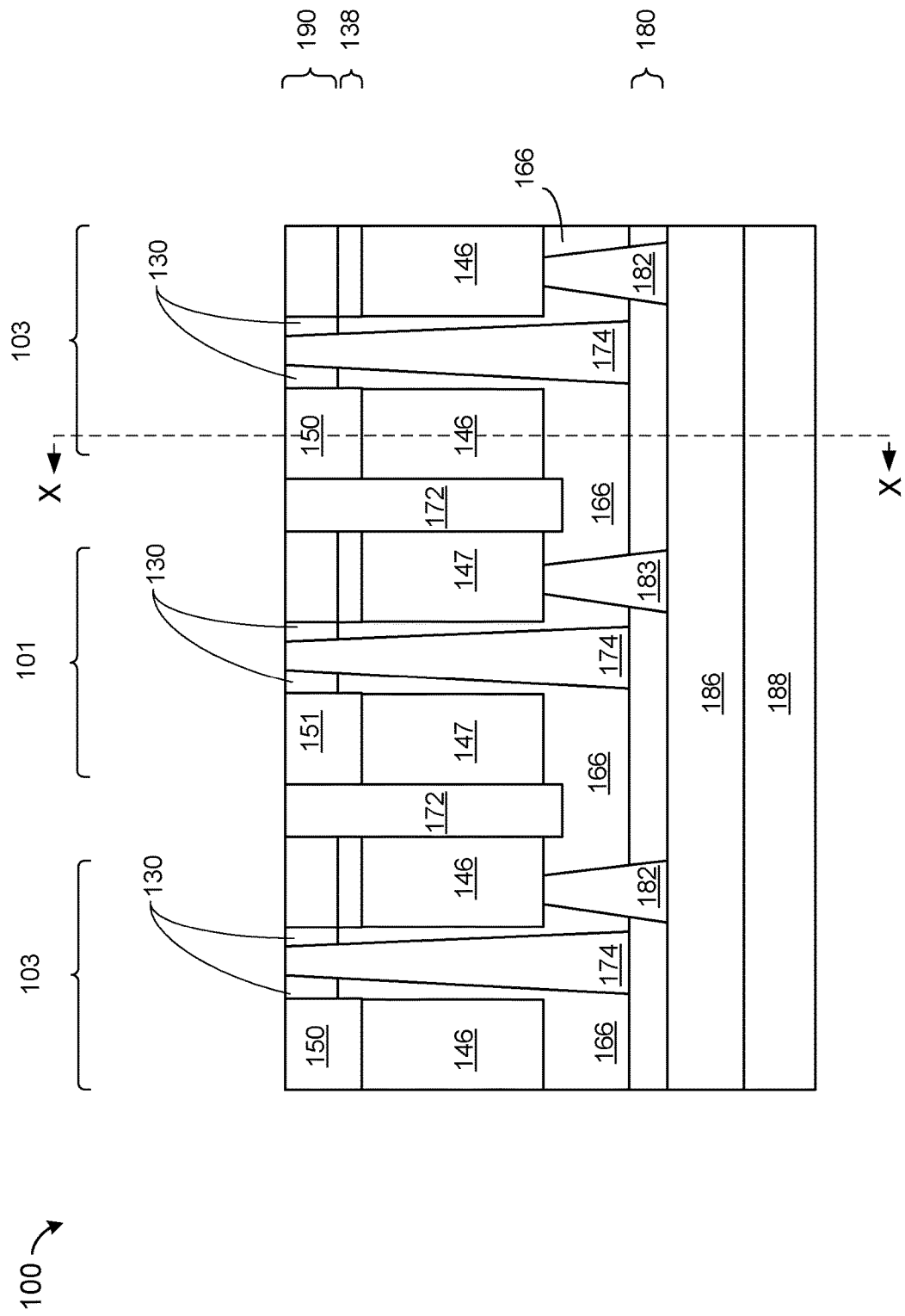

Referring now to FIGS. 17, 18 and 19, the structure 100 is shown according to an exemplary embodiment. FIGS. 17, 18 and 19 are each a cross-sectional view of the structure 100 along section lines X-X, Y1-Y1 and Y2-2, respectively. FIGS. 18 and 19 are parallel to each other, and FIG. 17 is perpendicular to FIGS. 18 and 19. A backside interlayer dielectric (hereinafter "ILD") 190 may be formed.

The ILD 190 may be formed on a (now) upper surface of the structure 100. The ILD 190 may be formed as described for the ILD 166. The ILD 190 may be formed on the BDI 138, the first, second sacrificial placeholders 150, 151, the gate cut dielectric 174, the dielectric pillar 172 and the STI 130. A chemical mechanical polishing (CMP) technique may be used to remove excess material and polish upper surfaces of the ILD 190, the first, second sacrificial placeholders 150, 151, the gate cut dielectric 174, the dielectric pillar 172 and the STI 130.

Figure 20:
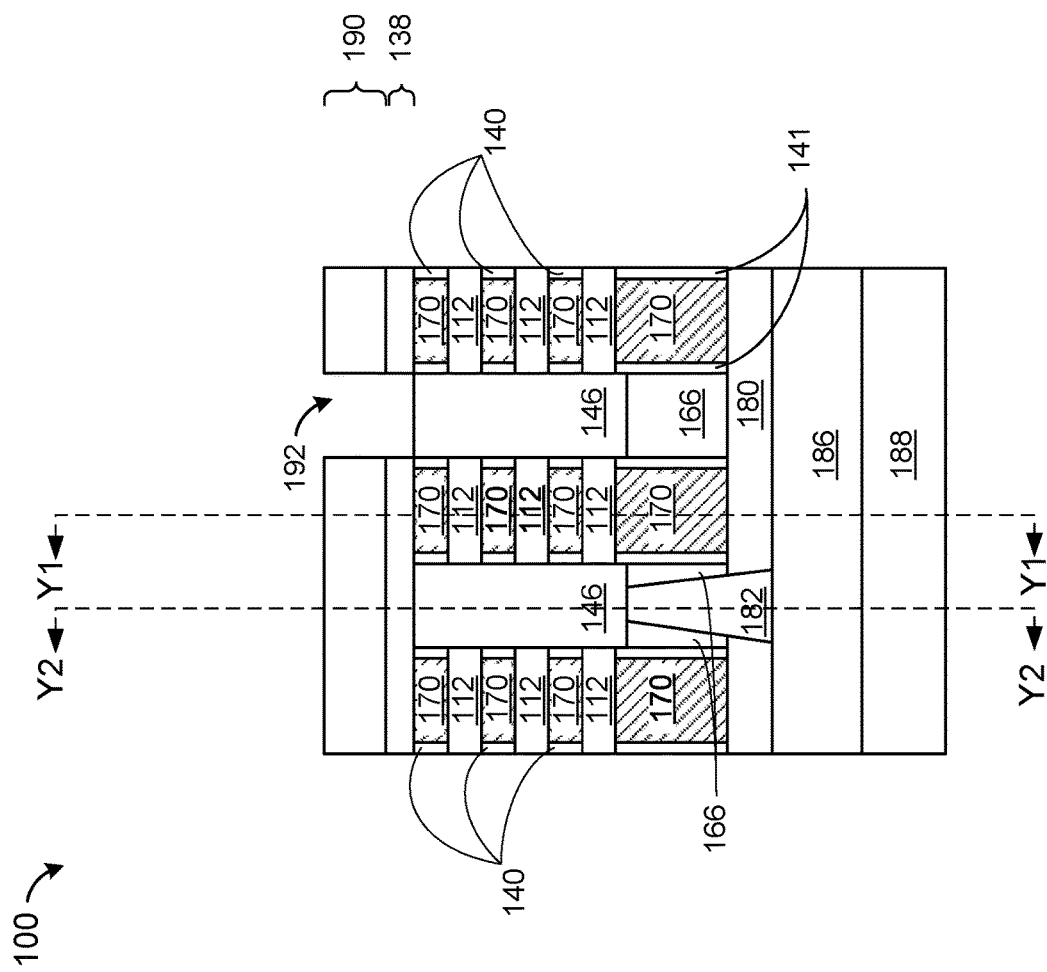
FIGS. 20, 21 and 22 each illustrate a cross-sectional view of the semiconductor structure of along section lines X-X, Y1-Y1 and Y2-Y2, respectively, and illustrate removal of a sacrificial placeholder, according to an embodiment.
Figure 21:
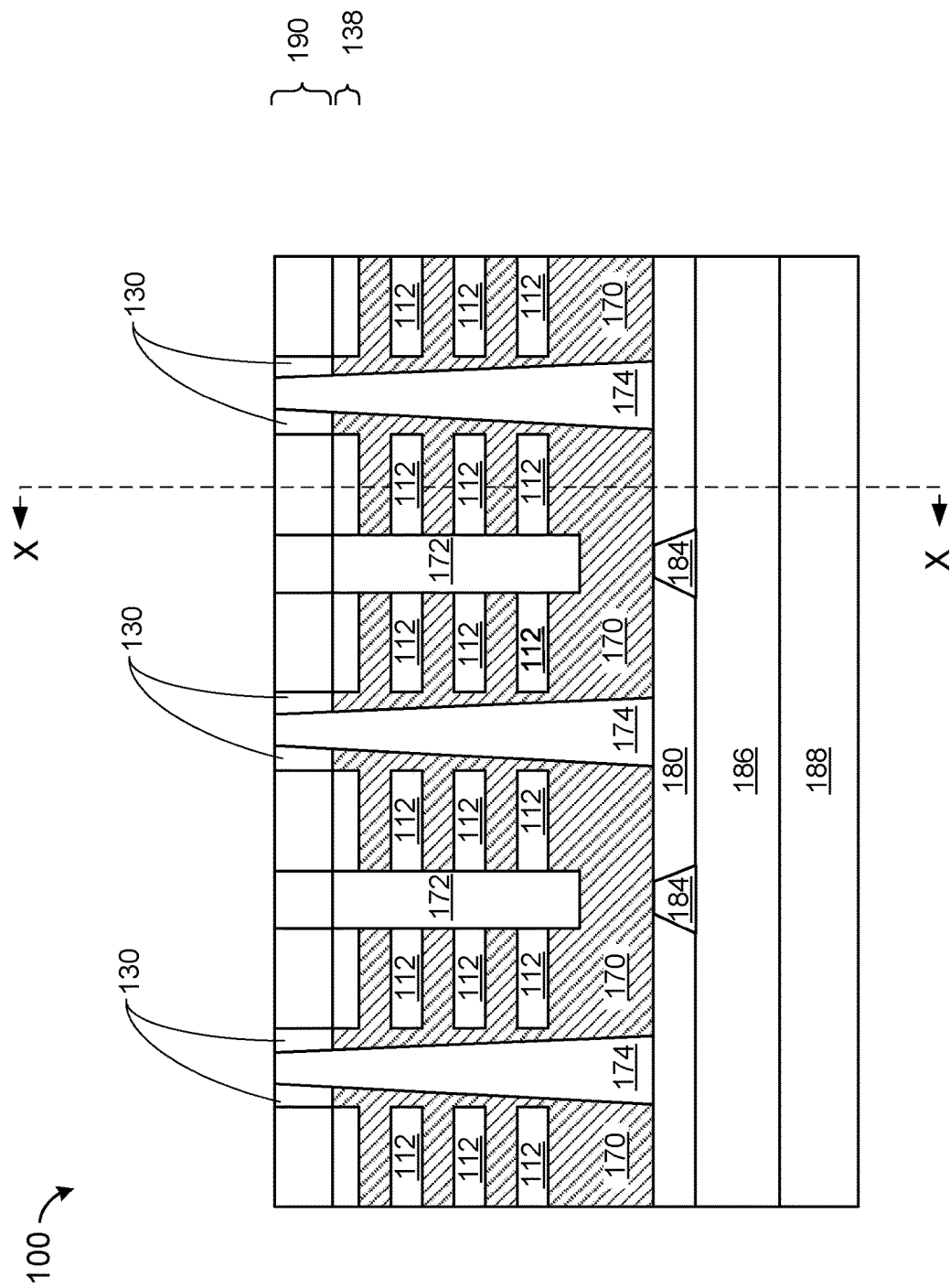
Figure 22:
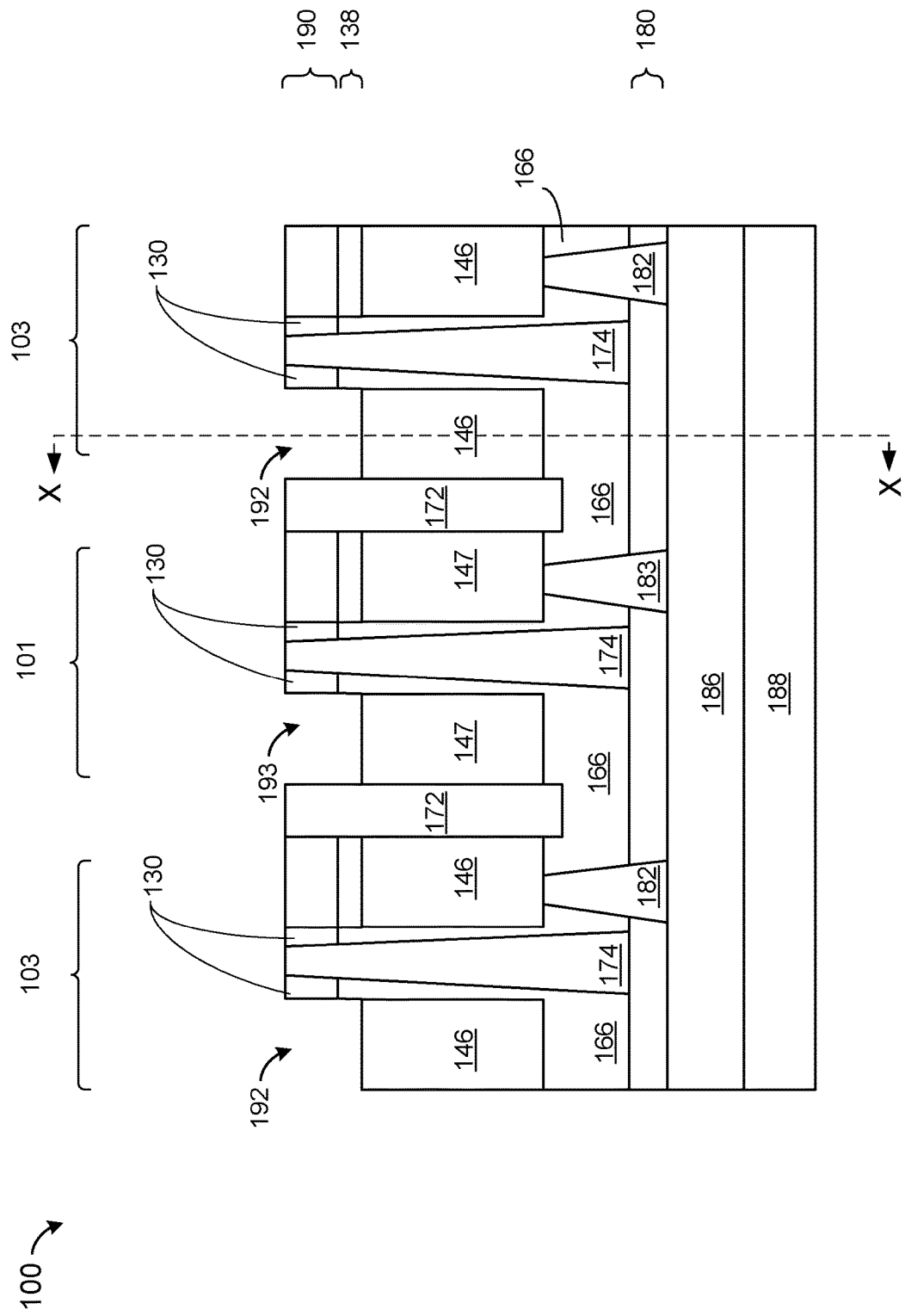

Referring now to FIGS. 20, 21 and 22, the structure 100 is shown according to an exemplary embodiment. FIGS. 20, 21 and 22 are each a cross-sectional view of the structure 100 along section lines X-X, Y1-Y1 and Y2-2, respectively. FIGS. 21 and 22 are parallel to each other, and FIG. 20 is perpendicular to FIGS. 21 and 22. FIG. 21 is the same as FIG. 18. The first sacrificial placeholder 150 and the second sacrificial placeholder 151 may be removed.

The first sacrificial placeholder 150 and the second sacrificial placeholder 151 may be removed using methods known in the arts, exposing an upper horizontal surface of the source drain 146, 147, respectively. The opening 192 may be formed where the first sacrificial placeholder 150 was removed. The opening 193 may be formed where the second sacrificial placeholder 151 was removed. Selective etching may be used to remove the first, second sacrificial placeholder 150, 151, exposing a vertical side surface of the BDI 138, a vertical side surface of the ILD 190, a vertical side surface of the STI 130 and a vertical side surface of the ILD 166. The material used for the etching process may be selective such that the BDI 138, the ILD 190, the ILD 166 and the STI 130 remain and are not etched.

Figure 23:
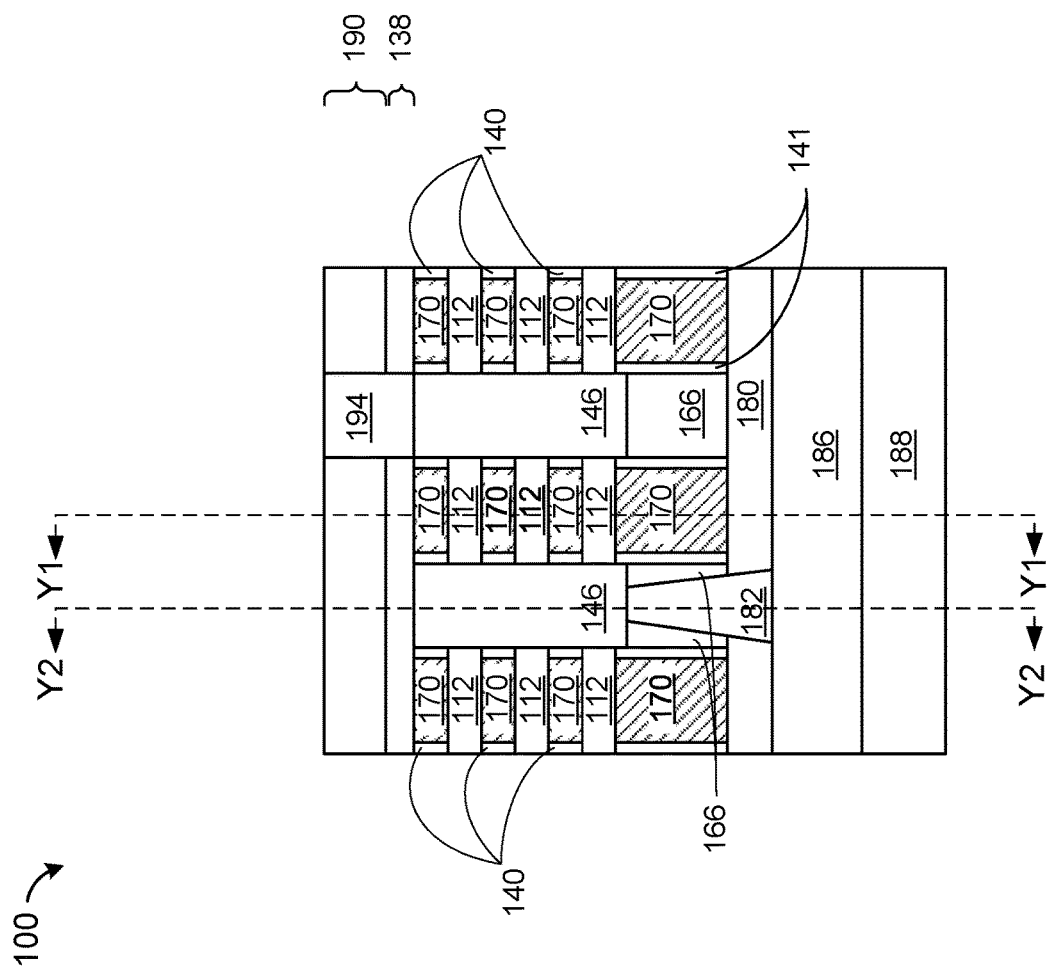
FIGS. 23, 24 and 25 each illustrate a cross-sectional view of the semiconductor structure of along section lines X-X, Y1-Y1 and Y2-Y2, respectively, and illustrate backside contact metallization, according to an embodiment.
Figure 24:
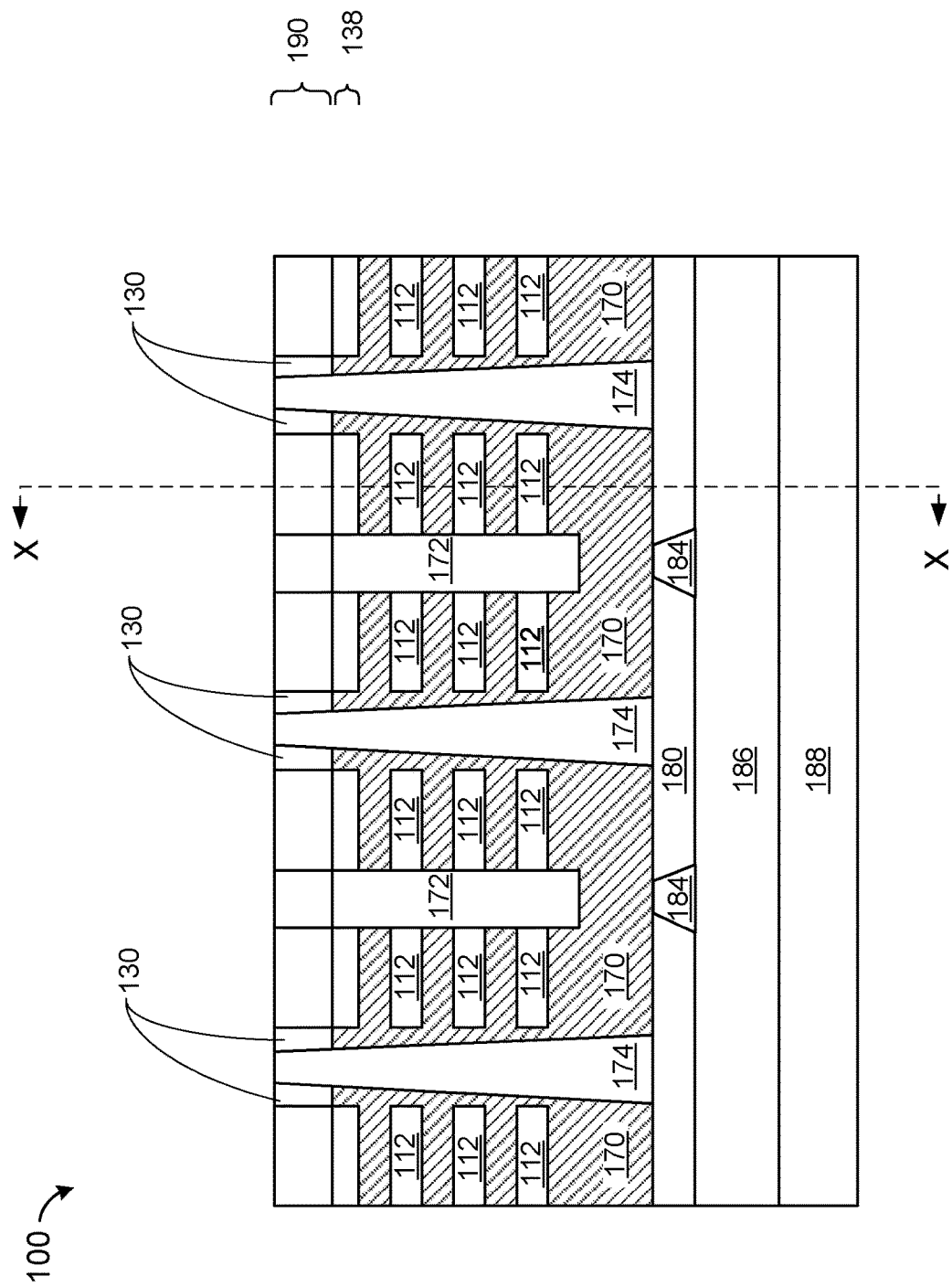
Figure 25:
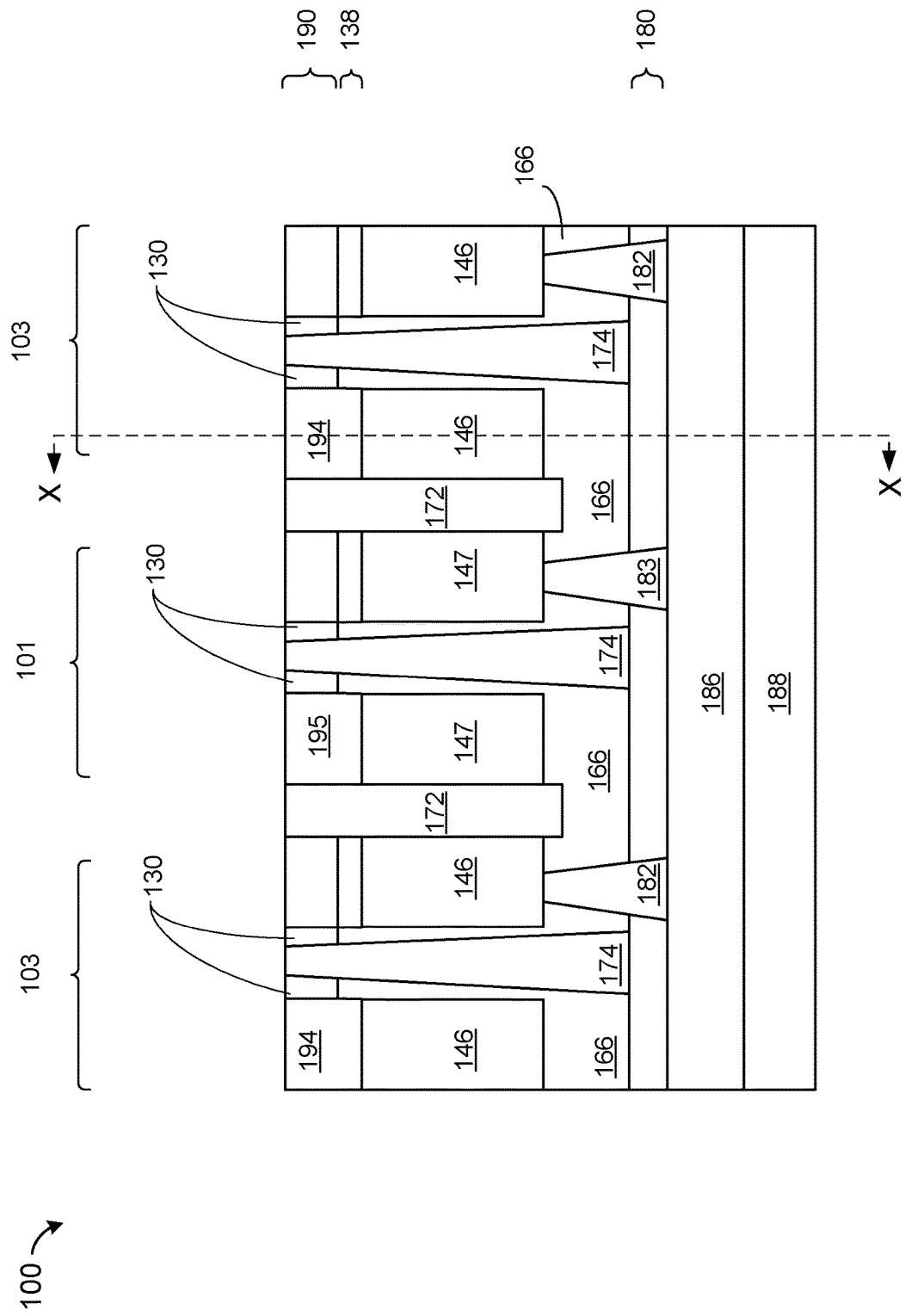

Referring now to FIGS. 23, 24 and 25, the structure 100 is shown according to an exemplary embodiment. FIGS. 23, 24 and 25 are each a cross-sectional view of the structure 100 along section lines X-X, Y1-Y1 and Y2-2, respectively. FIGS. 24 and 25 are parallel to each other, and FIG. 22 is perpendicular to FIGS. 24 and 25. FIG. 24 is the same as FIGS. 18 and 21. A backside contact 194 and a backside contact 195 are formed.

The backside contact 194 may be formed in the opening 192, forming a contact to the n-FET source drain 146. The backside contact 195 may be formed in the opening 193, forming a contact to the p-FET source drain 147. The backside contacts 194, 195 may be formed as described for the contacts 182, 183, 184.

A chemical mechanical polishing (CMP) technique may be used to remove excess material and polish upper surfaces of the ILD 190, the backside contacts 194, 195, the gate cut dielectric 174, the dielectric pillar 172 and the STI 130.

Figure 26:
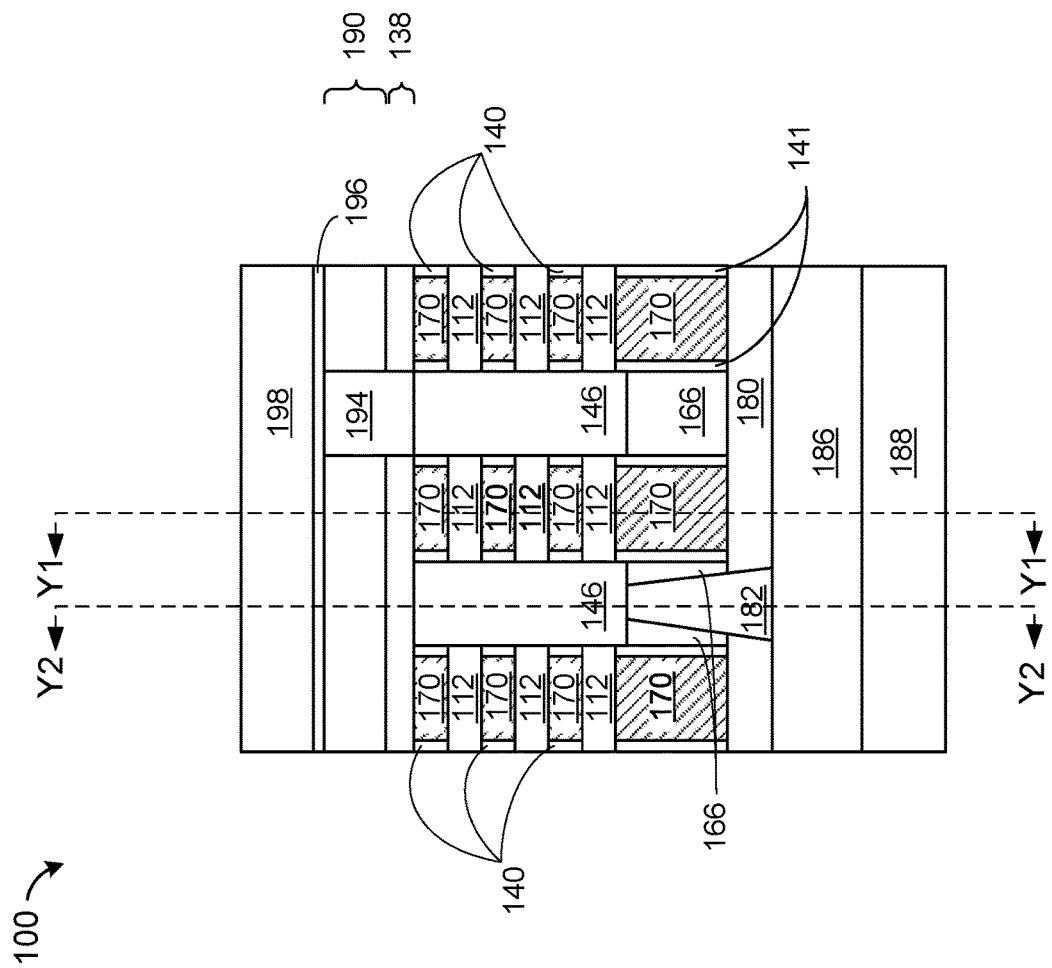
FIGS. 26, 27 and 28 each illustrate a cross-sectional view of the semiconductor structure of along section lines X-X, Y1-Y1 and Y2-Y2, respectively, and illustrate deposition of a metal liner and a bulk metal, according to an embodiment.
Figure 27:
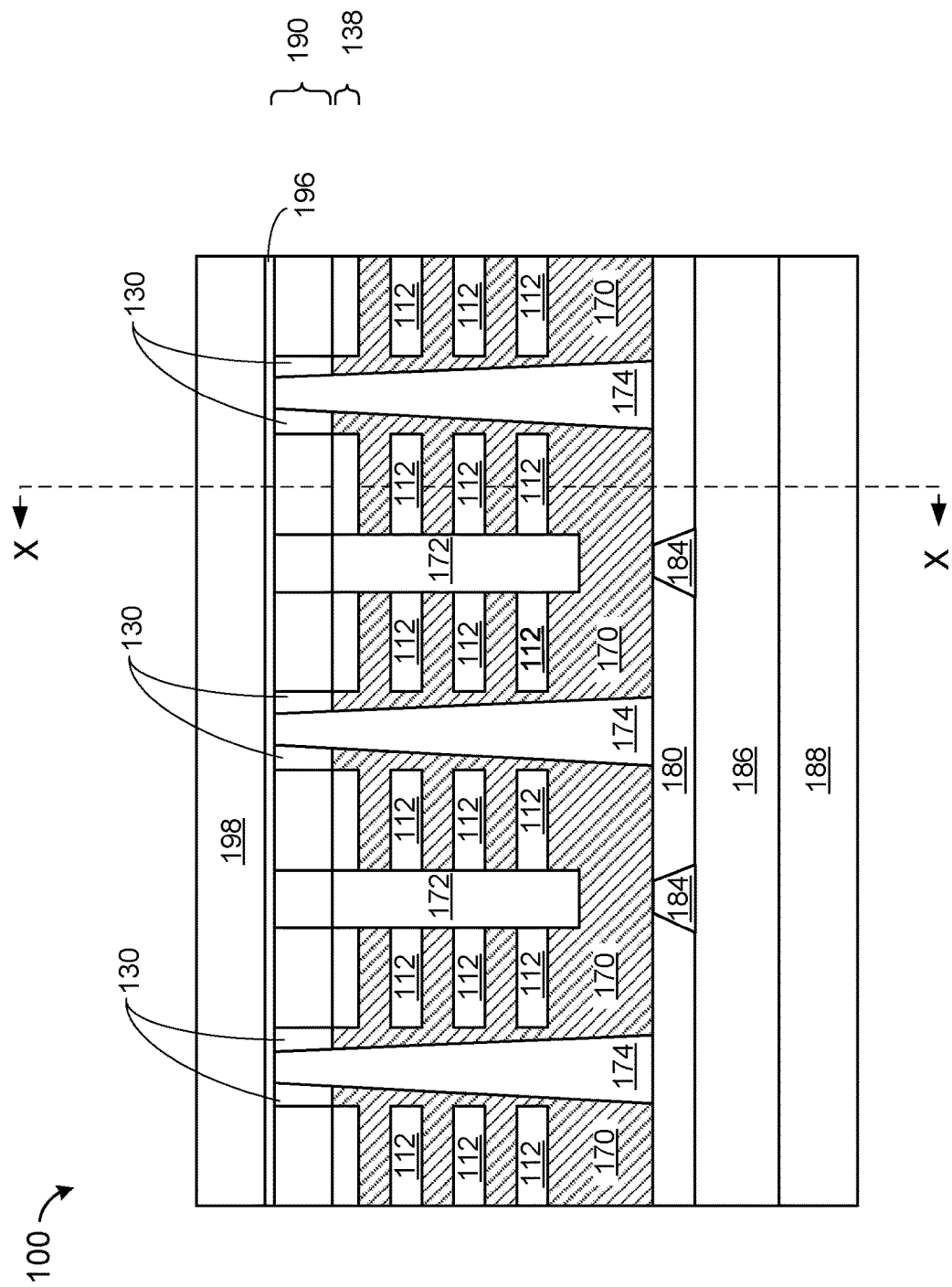
Figure 28:
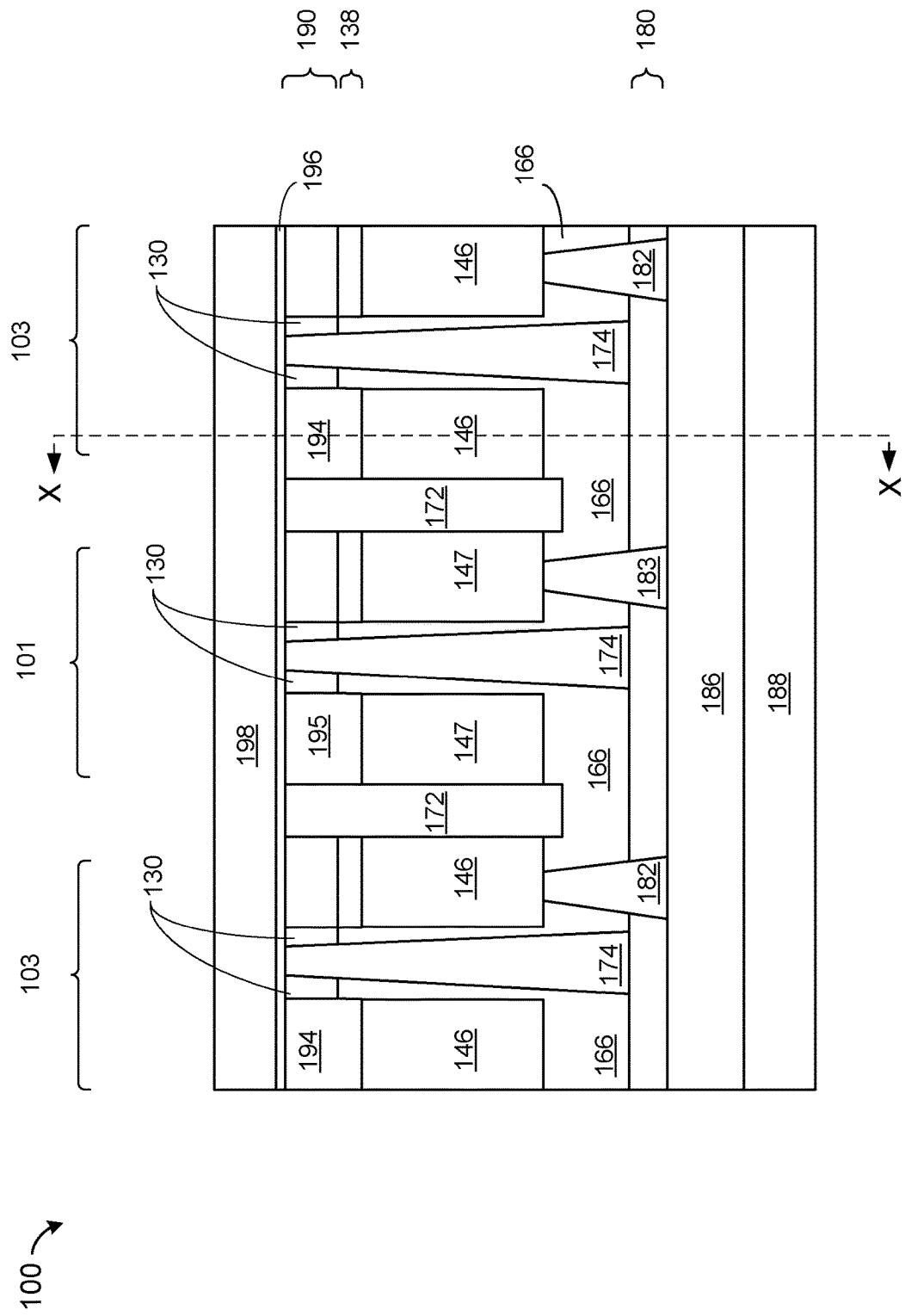

Referring now to FIGS. 26, 27 and 28, the structure 100 is shown according to an exemplary embodiment. FIGS. 26, 27 and 28 are each a cross-sectional view of the structure 100 along section lines X-X, Y1-Y1 and Y2-2, respectively. FIGS. 27 and 28 are parallel to each other, and FIG. 26 is perpendicular to FIGS. 27 and 28. A metal liner 196 and a bulk metal 198 are formed.

The metal liner 196 may be conformally formed on the structure 100, covering an upper surface of the ILD 190, the backside contacts 194, 195, the gate cut dielectric 174, the dielectric pillar 172 and the STI 130. The metal liner 196 may include an adhesion liner, such as TiN, or TaN. The metal liner 196 may be deposited using typical deposition techniques, for example, PVD, atomic layer deposition (ALD), molecular layer deposition (MLD), and chemical vapor deposition (CVD). The metal liner 196 may have a thickness of 1 to 5 nm.

The bulk metal 198 may be conformally formed on the structure 100, covering an upper surface of the metal liner 196. The bulk metal 198 may include a conductive metal, such as W, Co, Ru, or Mo. The bulk metal 198 may be deposited using typical deposition techniques, for example, PVD, atomic layer deposition (ALD), molecular layer deposition (MLD), and chemical vapor deposition (CVD). The bulk metal 198 may have a thickness of 50 to 200 nm.

Figure 29:
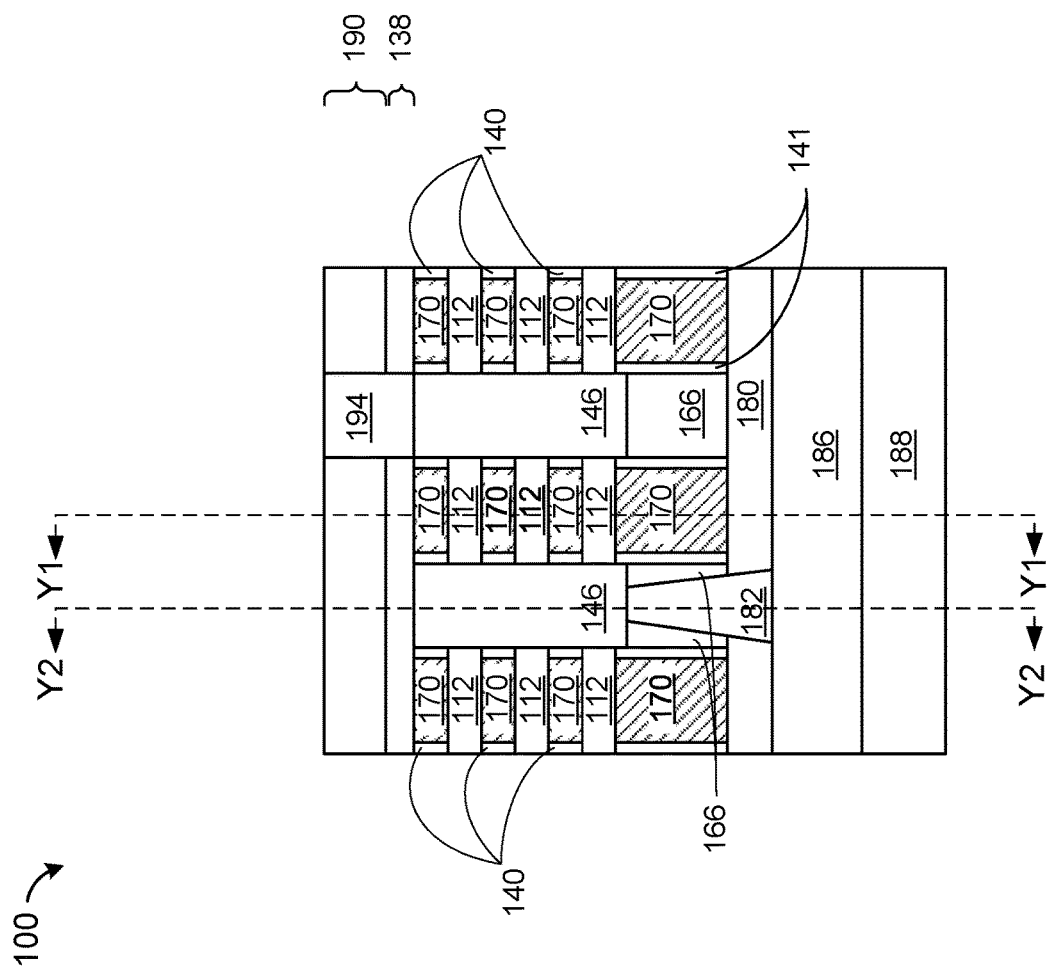
FIGS. 29, 30 and 31 each illustrate a cross-sectional view of the semiconductor structure of along section lines X-X, Y1-Y1 and Y2-Y2, respectively, and illustrate backside power rail patterning, according to an embodiment.
Figure 30:
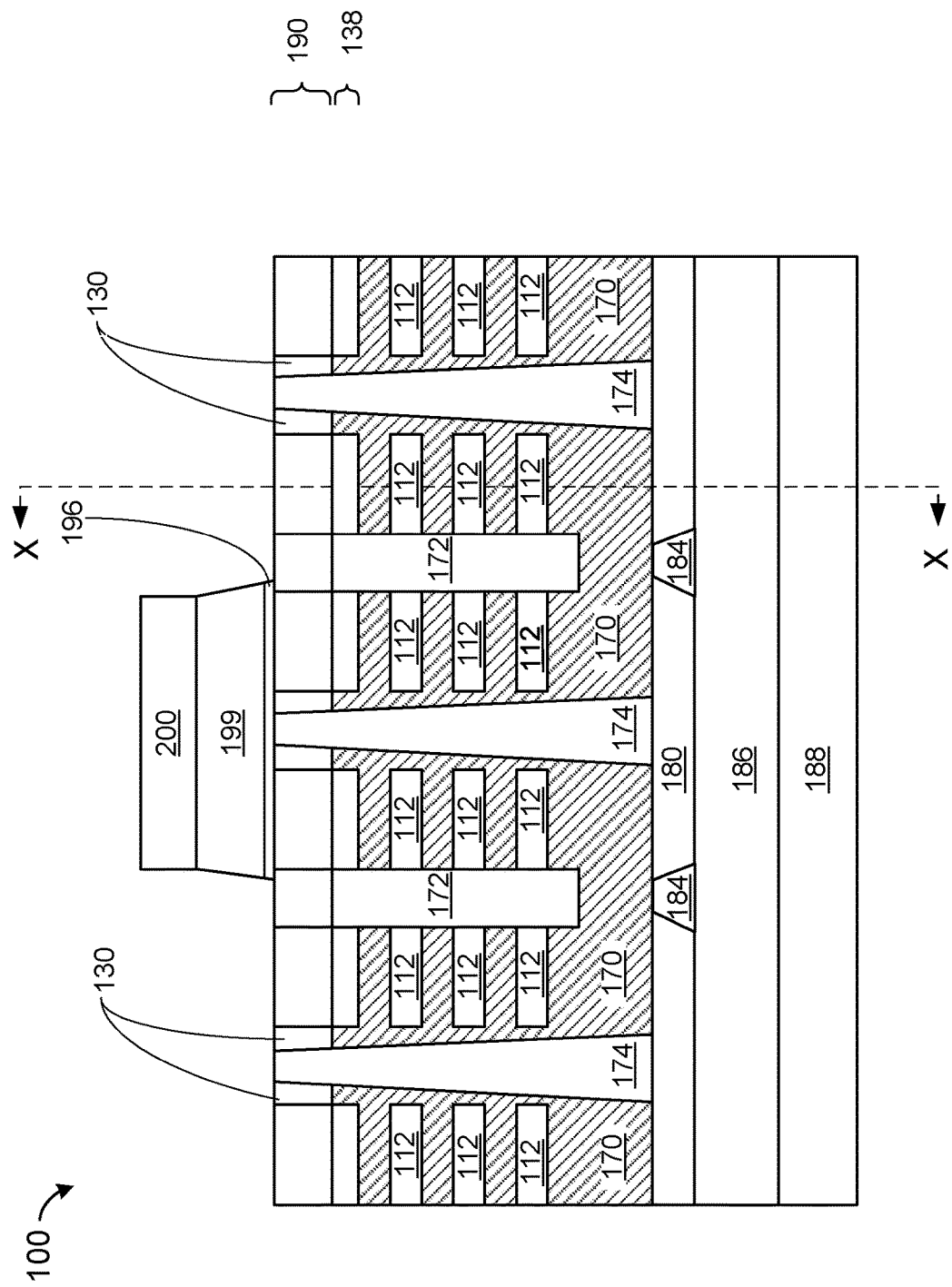
Figure 31:
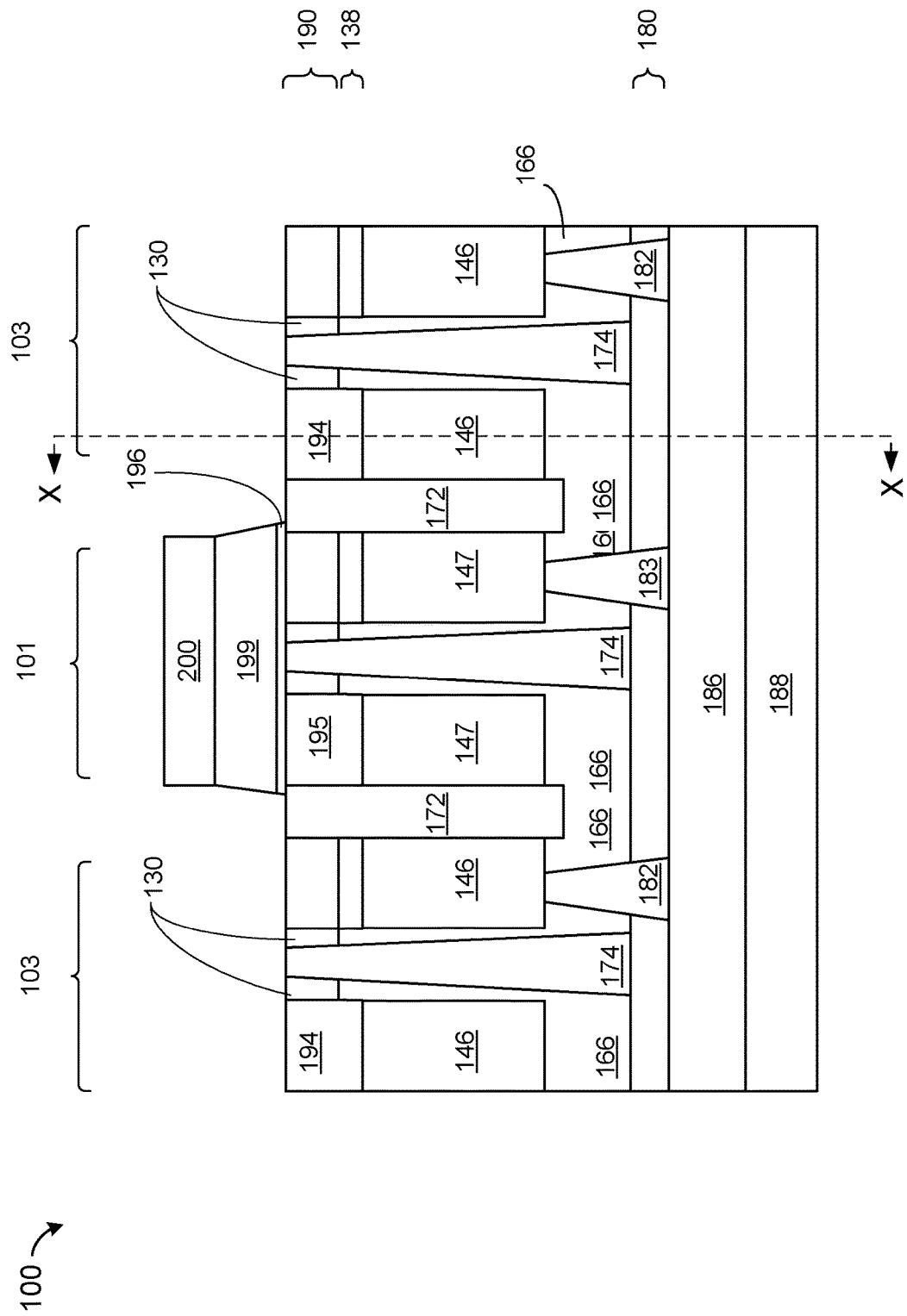

Referring now to FIGS. 29, 30 and 31, the structure 100 is shown according to an exemplary embodiment. FIGS. 29, 30 and 31 are each a cross-sectional view of the structure 100 along section lines X-X, Y1-Y1 and Y2-2, respectively. FIGS. 30 and 31 are parallel to each other, and FIG. 29 is perpendicular to FIGS. 30 and 31. A hard mask 200 is formed and patterning of the metal liner 196 and the bulk metal 198 is performed forming a first backside power rail 199.

The hard mask 200 may be formed using methods known in the arts, and may provide patterning for the metal liner 196 and the bulk metal 198. Portions of the metal liner 196 and the bulk metal 198 may be removed, using for example, an isotropic etch back process such as a reactive ion etch (RIE), exposing upper horizontal surfaces of the ILD 190, the backside contact 194, 195, the gate cut dielectric 174 and the STI 130.

Remaining portions of the bulk metal 198 may now be the first backside power rail 199. The first backside power rail 199 may be Vdd power supply, or may be Vss power supply. In an embodiment, the first backside power rail 199 provides Vdd power supply to the structure 100, specifically to the backside contact 195 which is a contact to the p-FET source drain 147, in the p-FET region 101. Alternatively, the first backside power rail 199 provides Vss power supply to the structure 100, specifically to the backside contact 194 which is a contact to the n-FET source drain 146, in the n-FET region 103.

Figure 32:
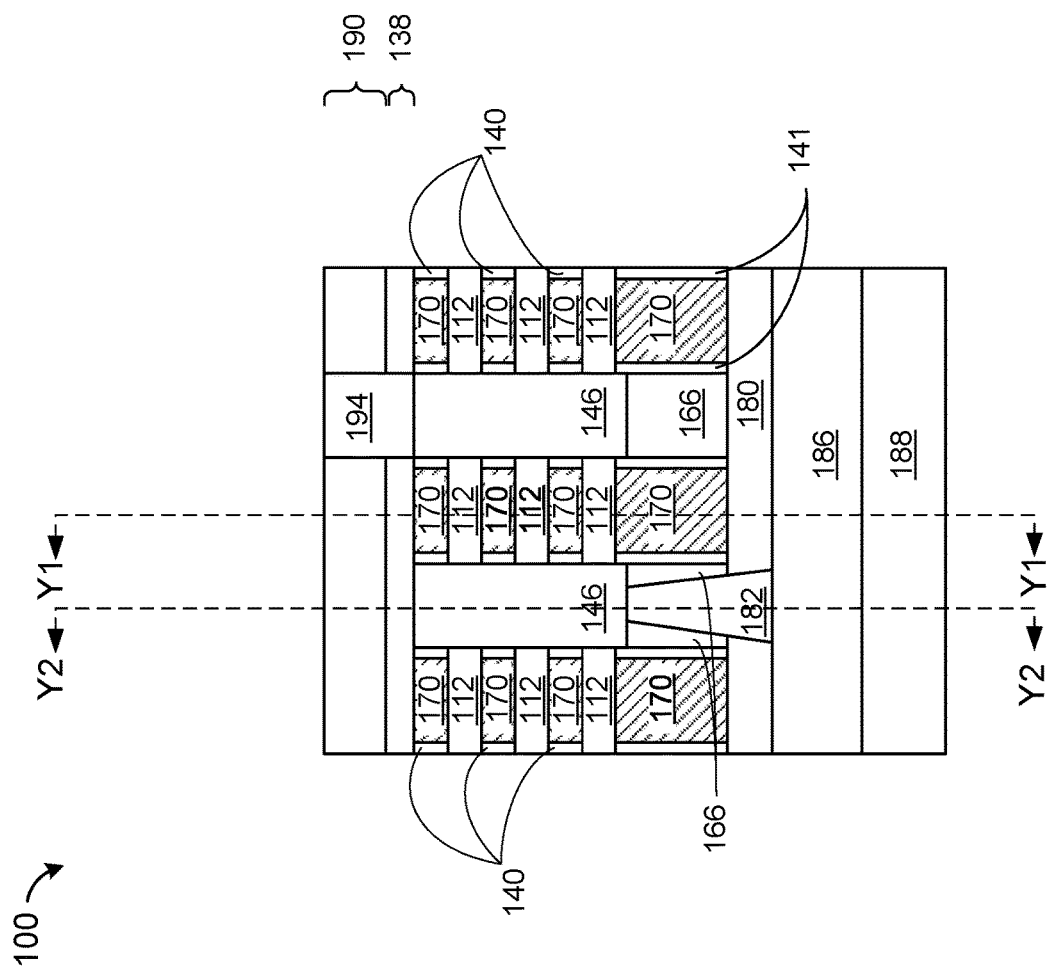
FIGS. 32, 33 and 34 each illustrate a cross-sectional view of the semiconductor structure of along section lines X-X, Y1-Y1 and Y2-Y2, respectively, and illustrate forming a self-aligned high-k spacer, according to an embodiment.
Figure 33:
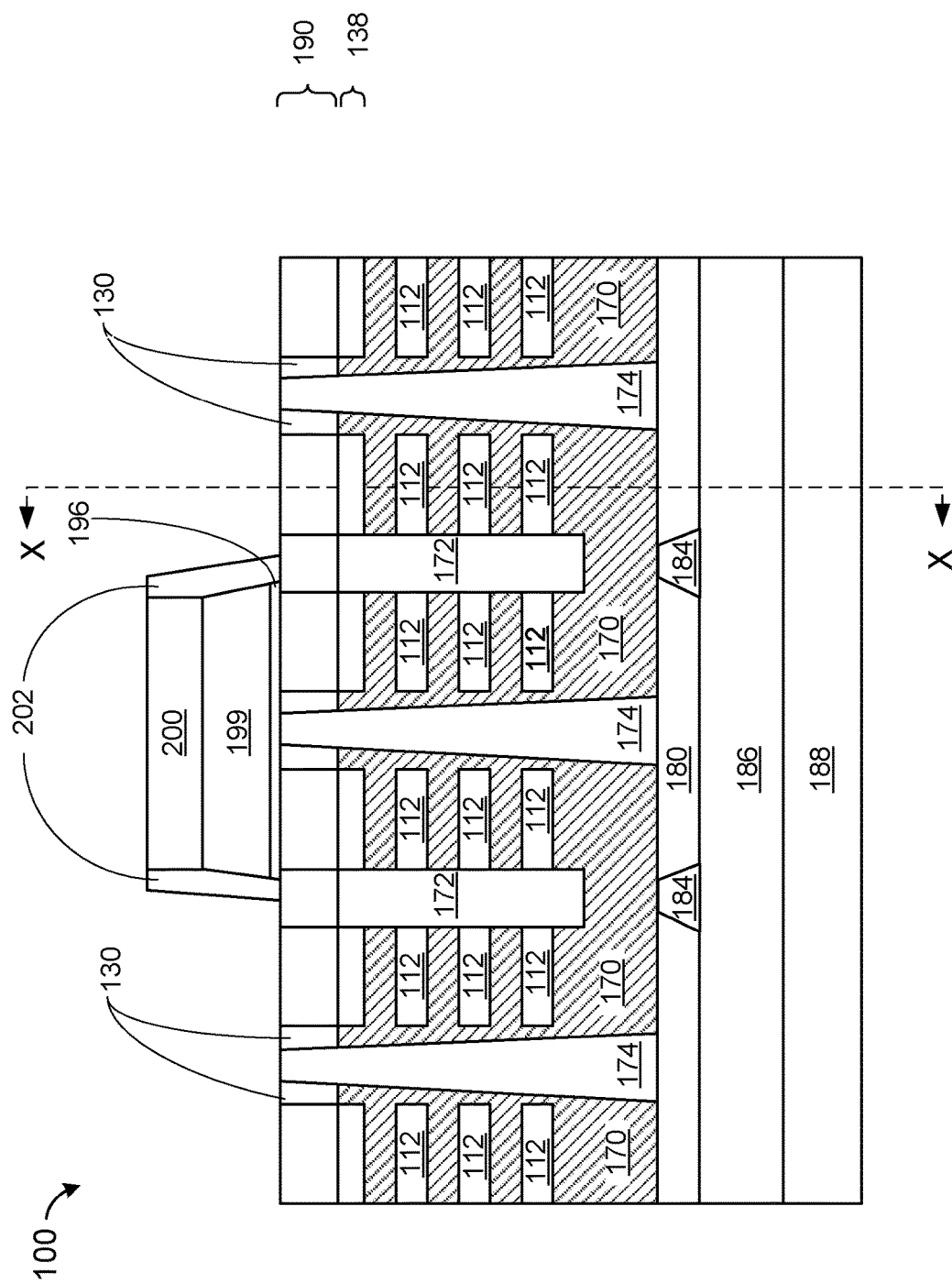
Figure 34:
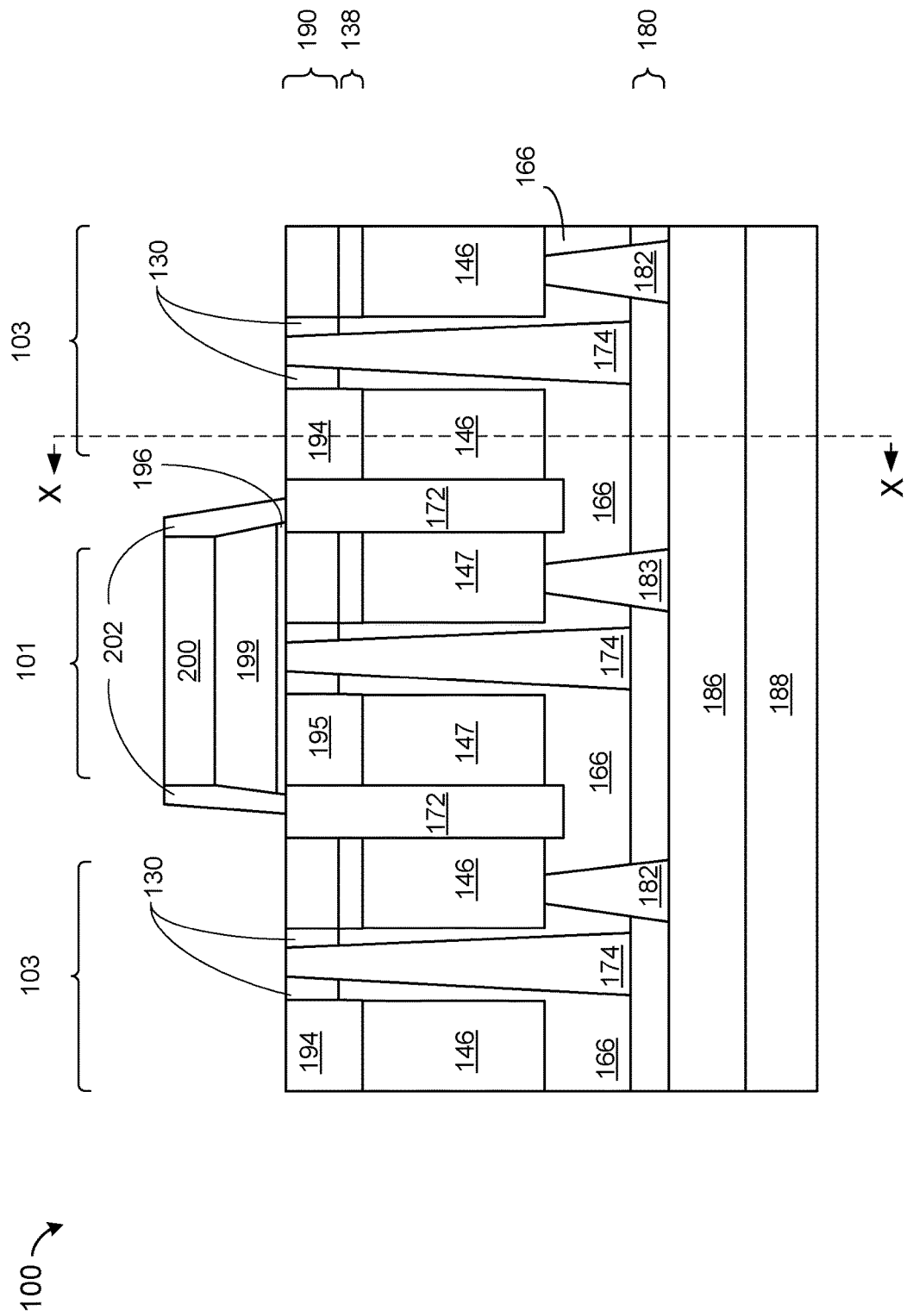

Referring now to FIGS. 32, 33 and 34, the structure 100 is shown according to an exemplary embodiment. FIGS. 32, 33 and 34 are each a cross-sectional view of the structure 100 along section lines X-X, Y1-Y1 and Y2-2, respectively. FIGS. 33 and 34 are parallel to each other, and FIG. 32 is perpendicular to FIGS. 33 and 34. A spacer 202 is formed.

The spacer 202 may be formed conformally on the structure 100 and portions removed, such that the spacer 202 remains on vertical side surfaces of the first backside power rail 199, the metal liner 196 and the hard mask 200. The spacer 202 may be deposited using typical deposition techniques, for example, atomic layer deposition (ALD), molecular layer deposition (MLD), and chemical vapor deposition (CVD). In an embodiment, the spacer 202 may include more than one layer, for example, a conformal layer SiO2 or a high-k dielectric material such as $HfO_2$, $ZrO_2$, $La_2O_3$, $Al_2O_3$, $TiO_2$, $SrTiO_3$, $LaAlO_3$, $Y_2O_3$, HfOxNy, ZrOxNy, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. In an embodiment, the spacer 202 may have a horizontal thickness of 5 to 10 nm. The spacer may have a k value of greater than 5. In comparison, the ILD 166, the ILD 180 and the STI 130 may have a k value ranging between 2.5 to 4.1. The spacer 202 may have a high k value because it provides a buffer between Vdd and Vss, the first backside power rail 199 and a to be formed second backside power rail, and a higher-k value increases a decoupling capacitance between power rails.

Figure 35:
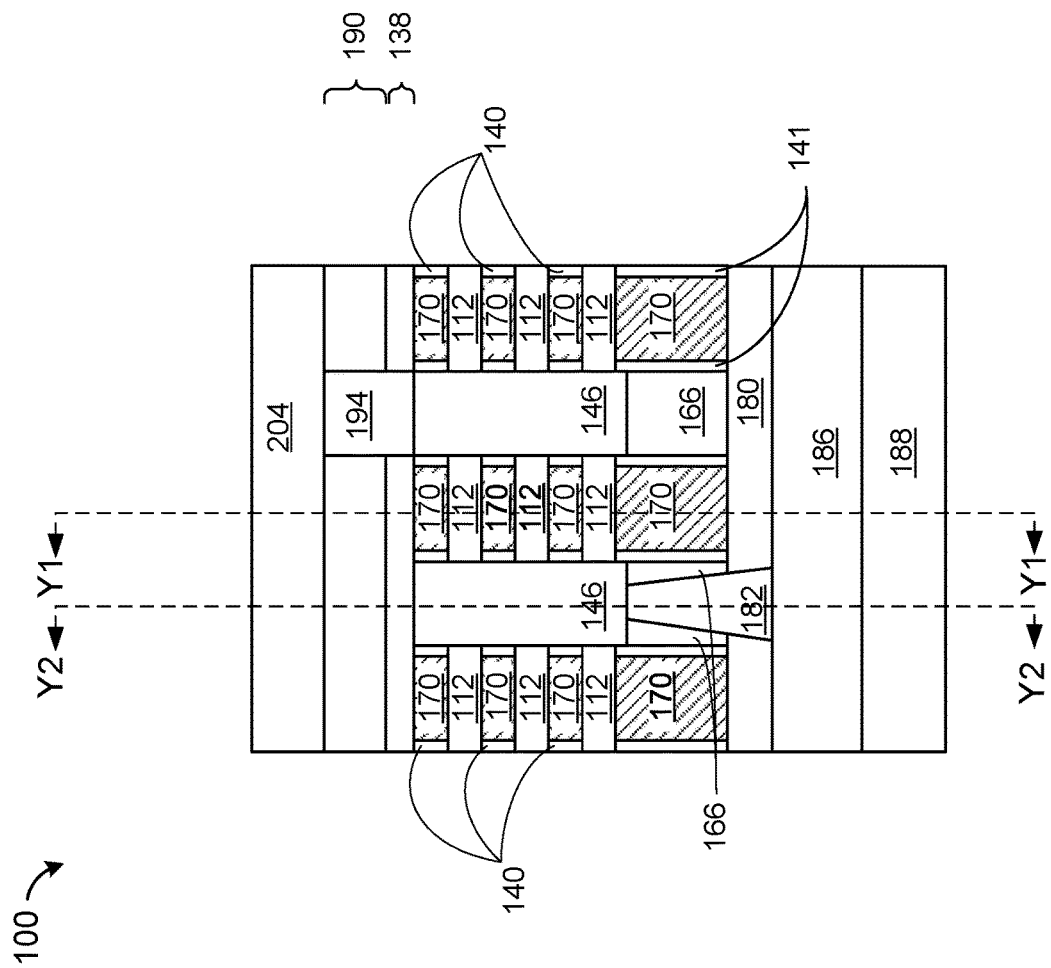
FIGS. 35, 36 and 37 each illustrate a cross-sectional view of the semiconductor structure of along section lines X-X, Y1-Y1 and Y2-Y2, respectively, and illustrate forming second backside power rail patterning, according to an embodiment.
Figure 36:
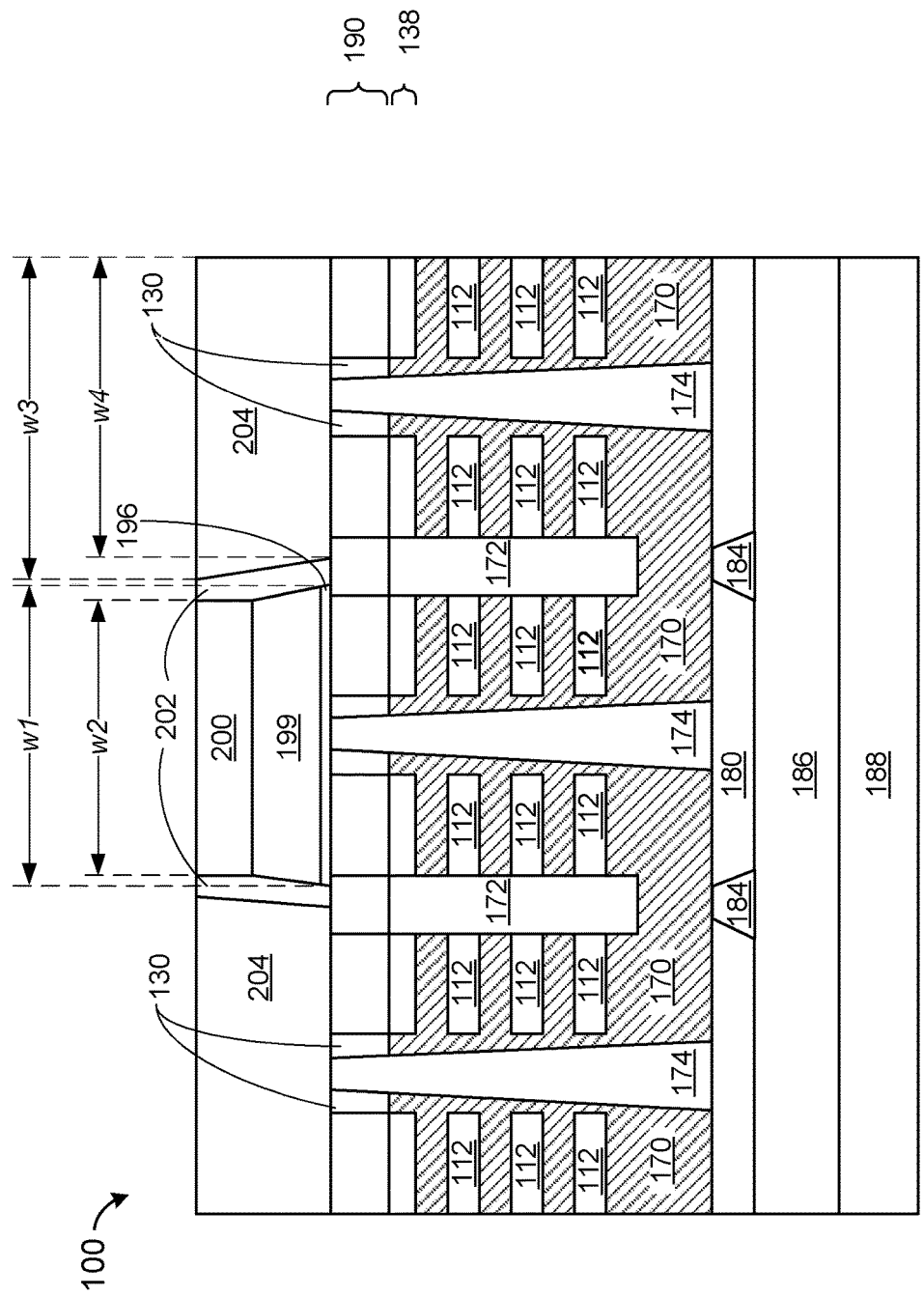
Figure 37:
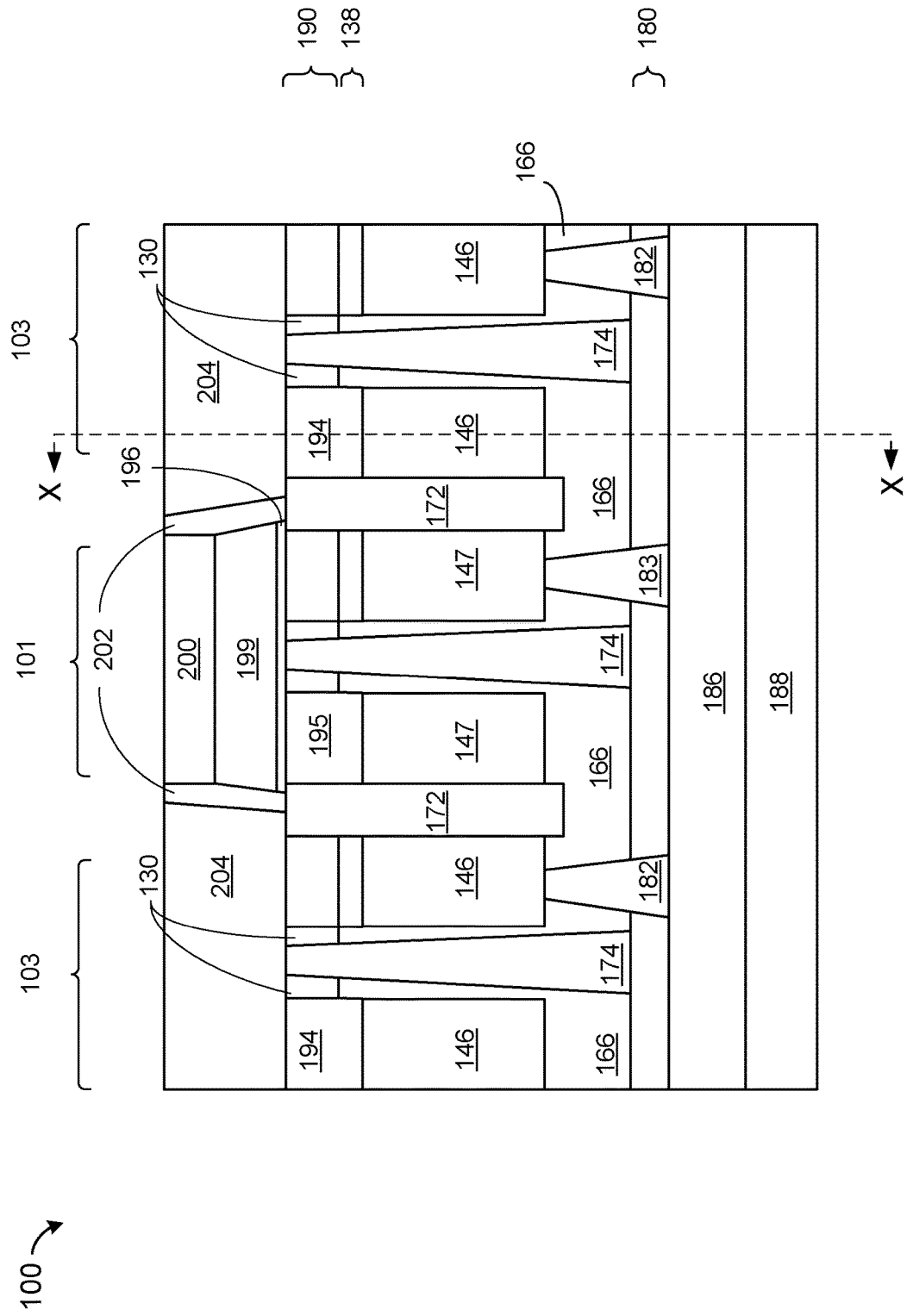

Referring now to FIGS. 35, 36 and 37, the structure 100 is shown according to an exemplary embodiment. FIGS. 35, 36 and 37 are each a cross-sectional view of the structure 100 along section lines X-X, Y1-Y1 and Y2-2, respectively. FIGS. 36 and 37 are parallel to each other, and FIG. 35 is perpendicular to FIGS. 36 and 37. A second backside power rail 204 is formed.

The second backside power rail 204 may be conformally formed on the structure 100, covering an upper surface of the hard mask 200, the spacer 202 and the first backside power rail 199. The second backside power rail 204 may be formed by a damascene process with metal such as Cu, Co, or W, followed by CMP. Damascene process is a conventional metallization process which trenches (or vias) are formed first in an interlayer dielectric (ILD) followed by metal deposition and CMP. In an embodiment, a thin metal liner such as TiN may be deposited prior to bulk metal fill.

The second backside power rail 204 may be Vss, or may be Vdd. In an embodiment, the first backside power rail 199 is Vdd and the second backside power rail 204 is Vss. The second backside power rail 204 provides power to the structure 100, including power to the backside contact 194 which is a contact to the n-FET source drain 146 in the n-FET region 103. In an alternate embodiment, the first backside power rail 199 is Vss and the second backside power rail 204 is Vdd. The spacer 202 provides isolation between the first backside power rail 199 and the second backside power rail 204.

The first backside power rail 199 may have a vertical side surface which is tapered with a wider upper horizontal surface than a lower horizontal surface, resulting in a trapezoid shape. A width, w1, is a width of an upper horizontal surface of the first backside power rail 199 (as the structure 100 is upside down in FIG. 36). A width, w2, is a width of the first backside power rail 199 at a lower horizontal surface of the first backside power rail 199 (as the structure 100 is upside down). The width w1 is greater than w2.

The second backside power rail 204 may have a vertical side surface which is tapered with a wider lower horizontal surface than an upper horizontal surface, resulting in a trapezoid shape. A width, w4, is a width of an upper horizontal surface of the second backside power rail 204 (as the structure 100 is upside down). A width, w3, is a width of the backside power rail at a lower horizontal surface of the second backside power rail 204 (as the structure 100 is upside down). The width w3 is greater than w4.

Specifically, the first backside power rail 199 and the second backside power rail 204 may have tapered vertical side surfaces which taper in opposite directions from each other. The first backside power rail 199 is tapered with a wider upper horizontal surface than a lower horizontal surface. The second backside power rail 204 is tapered with a wider lower horizontal surface than an upper horizontal surface. This is due to the formation of the first backside power rail 199 by subtractive metal etch and the formation of the second backside power rail 204 by damascene process.

Figure 38:
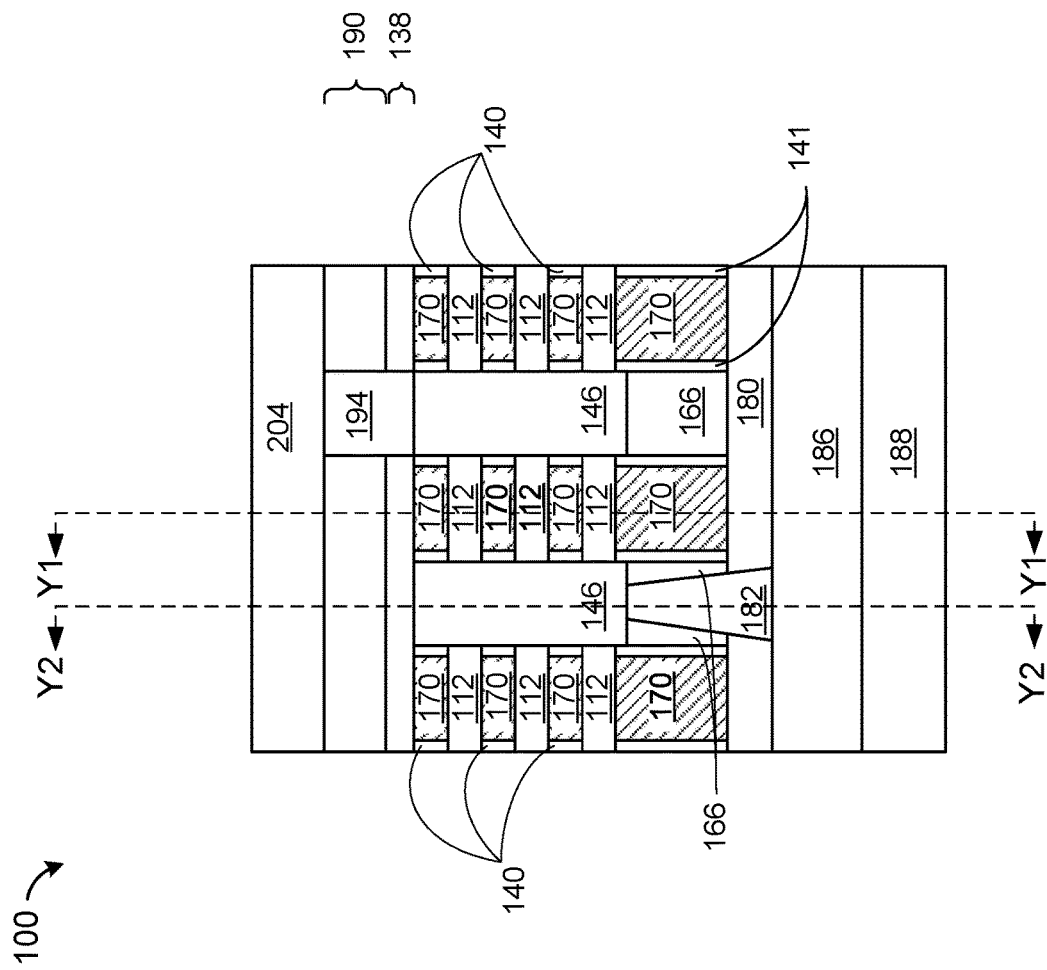
FIGS. 38, 39 and 40 each illustrate a cross-sectional view of the semiconductor structure of along section lines X-X, Y1-Y1 and Y2-Y2, respectively, and illustrate planarization, according to an embodiment.
Figure 39:
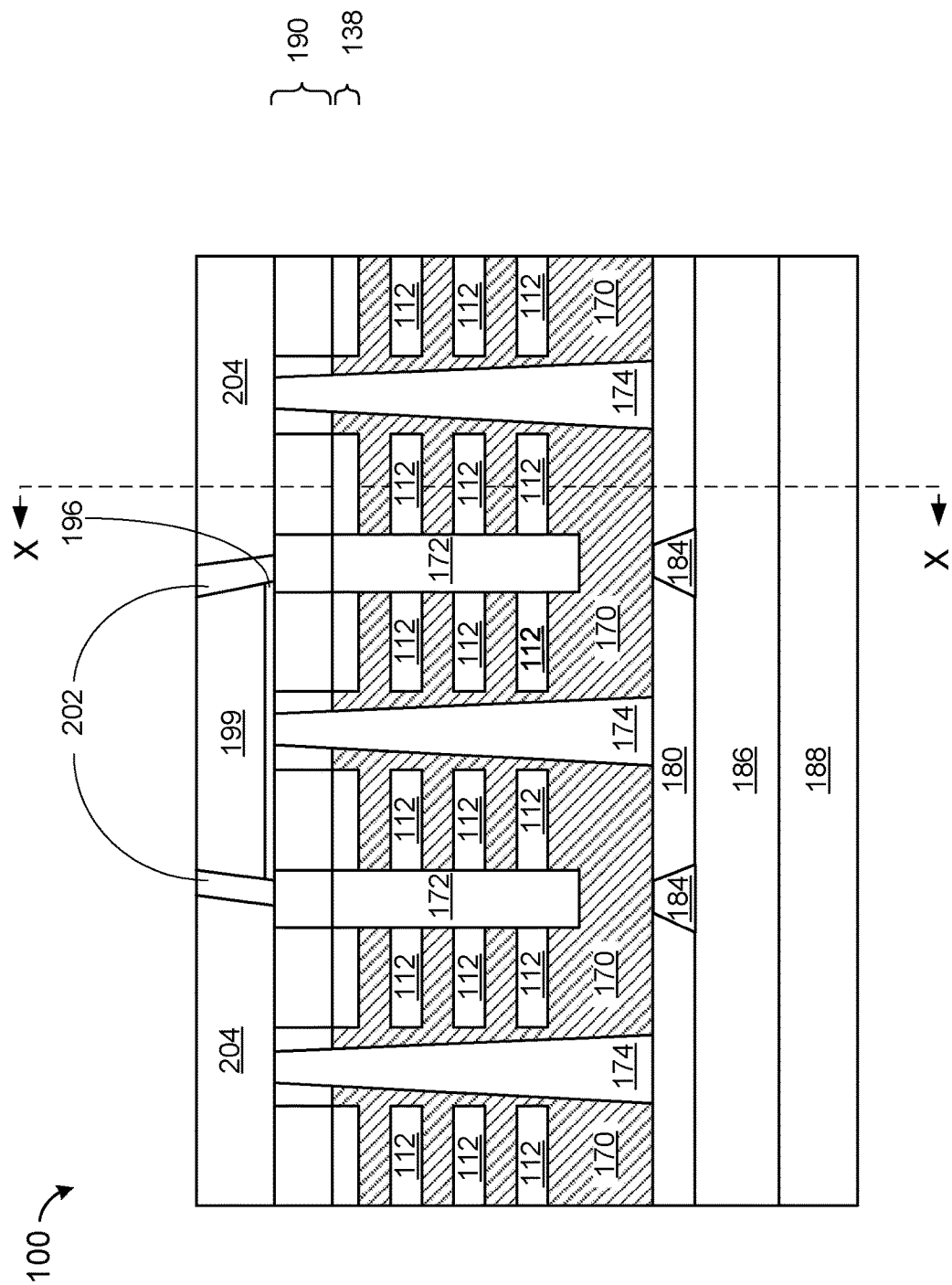
Figure 40:
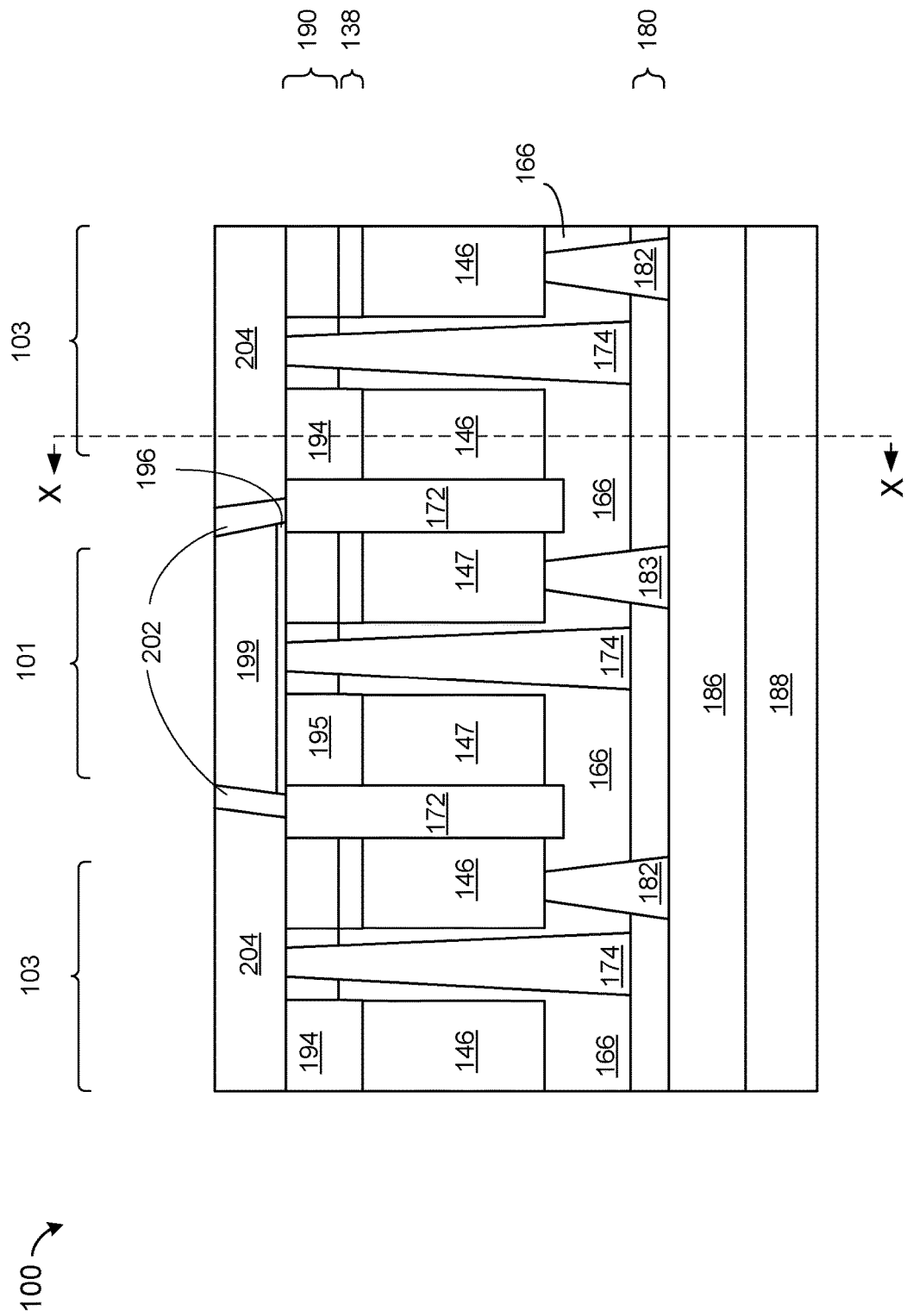

Referring now to FIGS. 38, 39 and 40, the structure 100 is shown according to an exemplary embodiment. FIGS. 38, 39 and 40 are each a cross-sectional view of the structure 100 along section lines X-X, Y1-Y1 and Y2-2, respectively. FIGS. 39 and 40 are parallel to each other, and FIG. 38 is perpendicular to FIGS. 39 and 40. The hard mask 200 may be removed.

A chemical mechanical polishing (CMP) technique may be used to remove excess material and polish upper surfaces of the first backside power rail 199, the second backside power rail 204 and the spacer 202, and to remove the hard mask 200.

Figure 41:
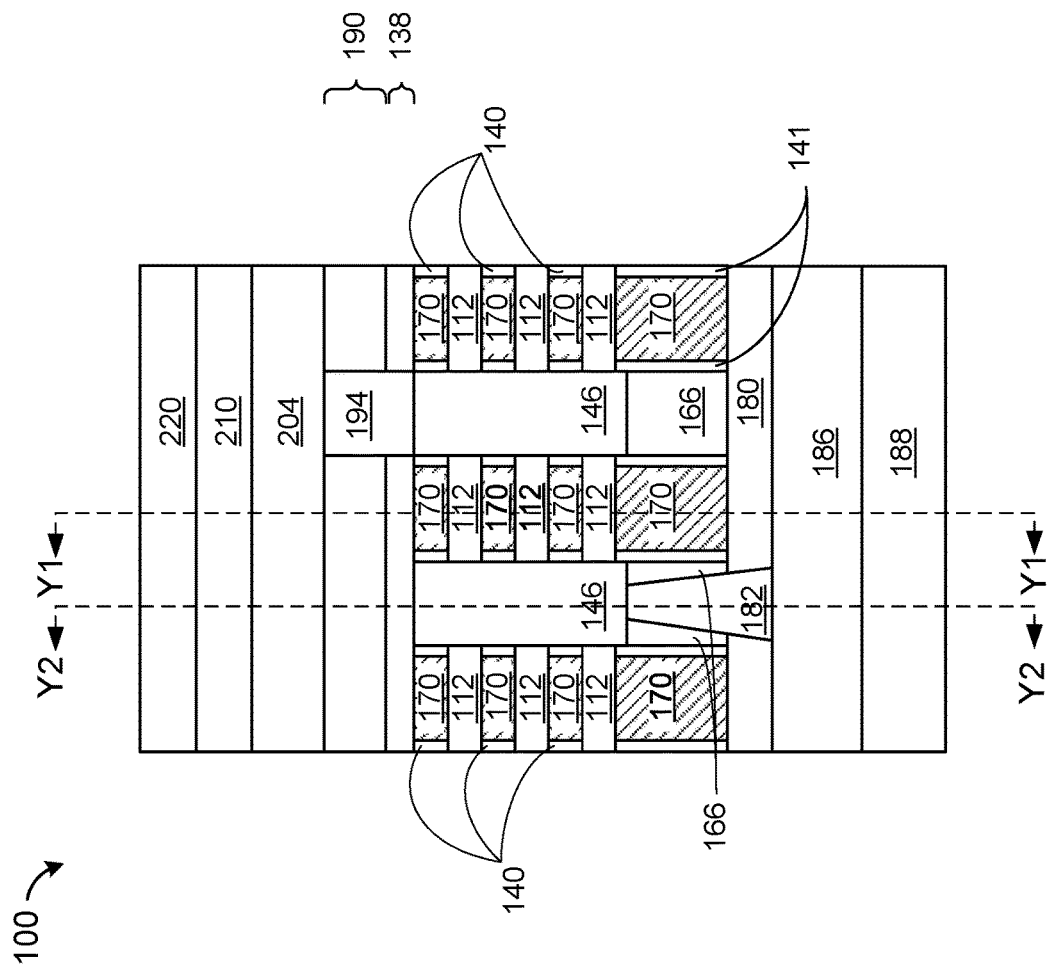
FIGS. 41, 42 and 43 each illustrate a cross-sectional view of the semiconductor structure of along section lines X-X, Y1-Y1 and Y2-Y2, respectively, and illustrate forming an additional backside power distribution network, according to an embodiment.
Figure 42:
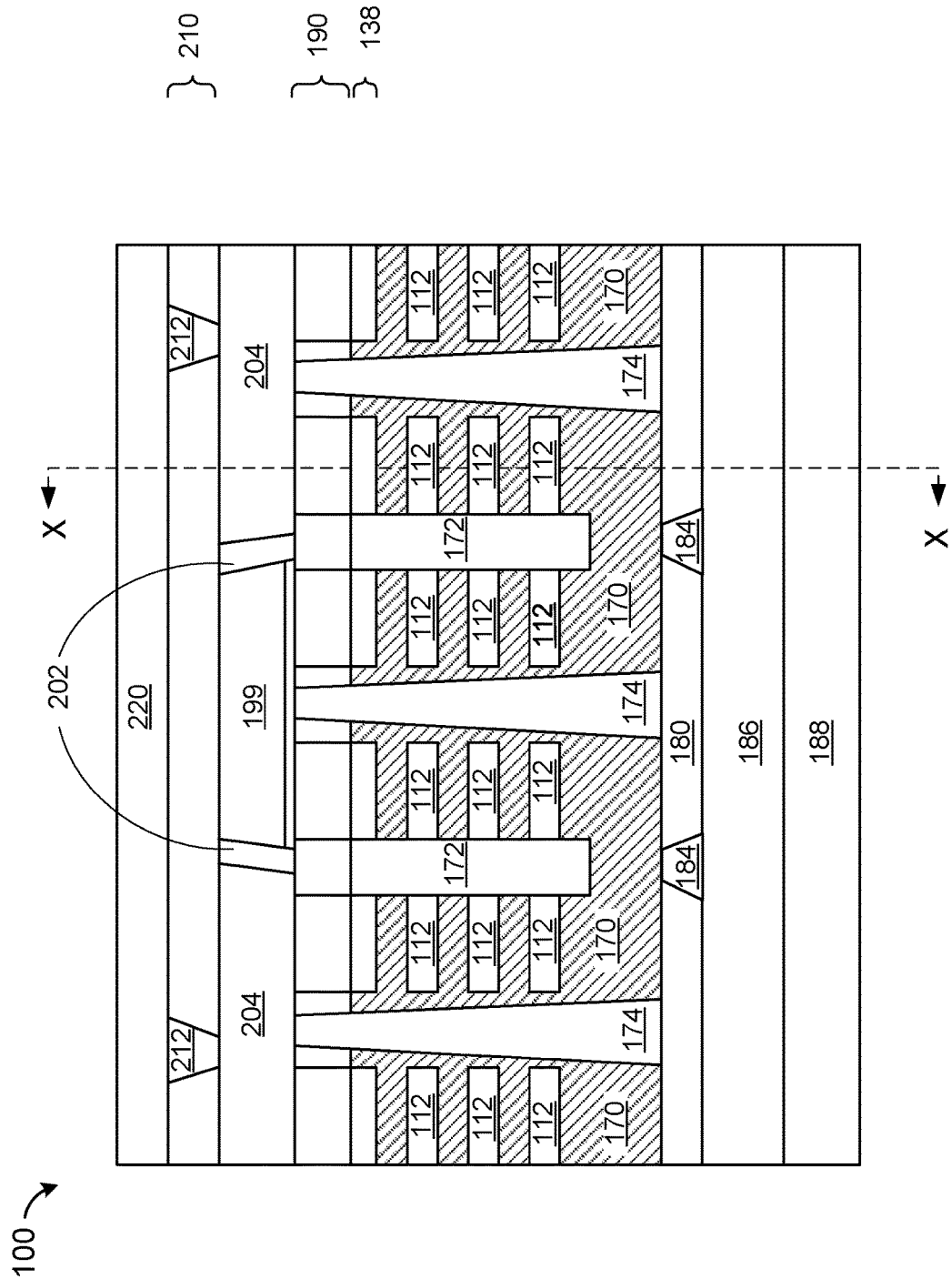
Figure 43:
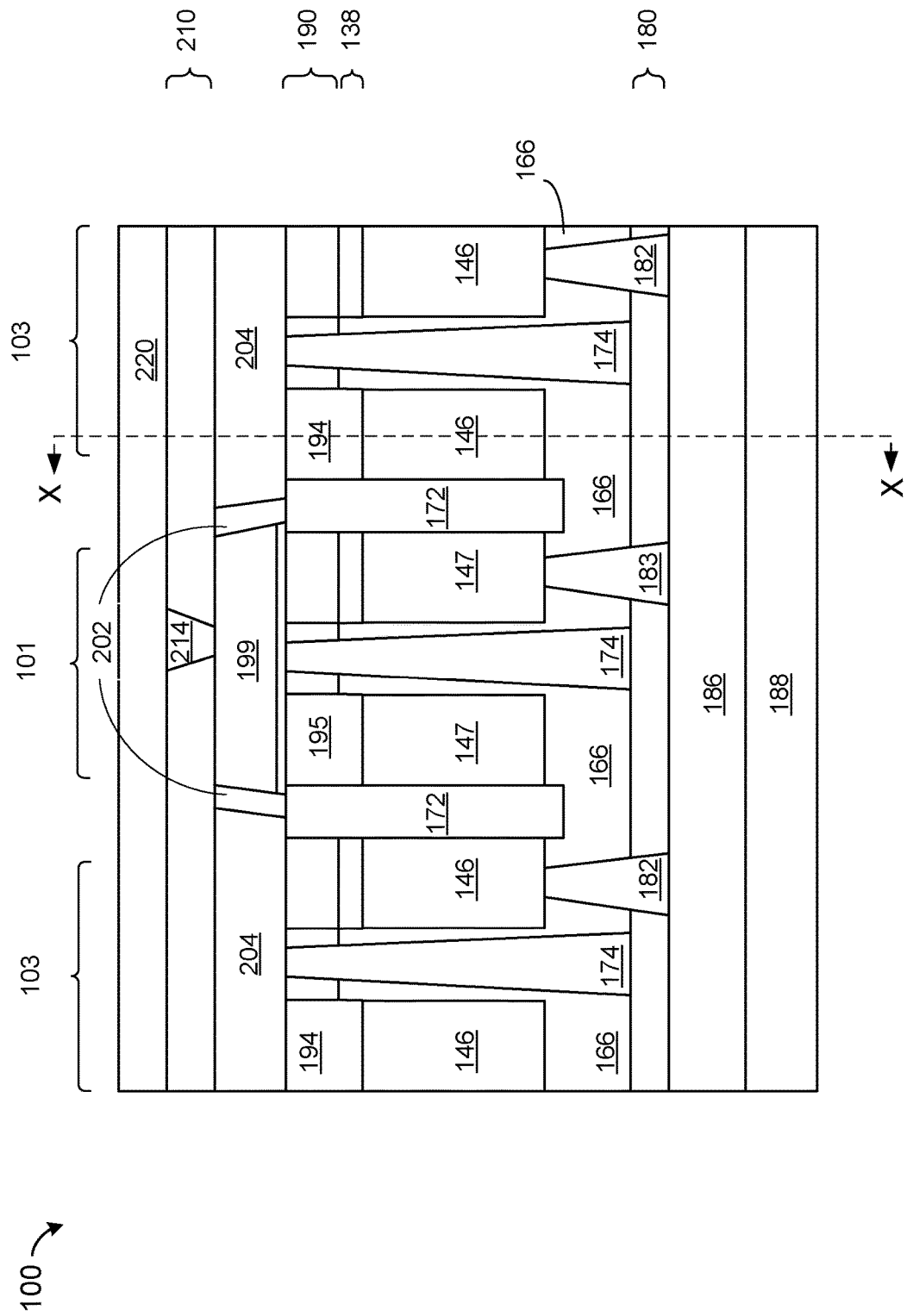

Referring now to FIGS. 41, 42 and 43, the structure 100 is shown according to an exemplary embodiment. FIGS. 41, 42 and 43 are each a cross-sectional view of the structure 100 along section lines X-X, Y1-Y1 and Y2-2, respectively. FIGS. 42 and 43 are parallel to each other, and FIG. 41 is perpendicular to FIGS. 42 and 43. An interlayer dielectric (hereinafter "ILD") 210, a via 212, a via 214 and a backside interconnect layer 220 may be formed.

The ILD 210 may be formed conformally on the structure 100 as described for the ILD 166, covering upper surface of the first backside power rail 199, the second backside power rail 204 and the spacer 202. A chemical mechanical polishing (CMP) technique may be used to remove excess material and polish upper surfaces of the ILD 210.

Via openings (not shown) may be formed in the ILD 210. Via 212 and via 214 may be formed in the via openings (not shown). The via 212 may provide a contact to the second backside power rail 204. The via 214 may provide a contact to the first backside power rail 199. The via 212, 214 may be formed by a damascene process, as described for the second backside power rail 204. Damascene process is a conventional metallization process which trenches (or vias) are formed first in an interlayer dielectric (ILD) followed by metal deposition and CMP. A chemical mechanical polishing (CMP) technique may be used to remove excess material and polish upper surfaces of the ILD 210 and the via 212, 214.

The backside interconnect layer 220 may be formed on the ILD 210 and on the vias 212, 214. The backside interconnect layer 220 may also be referred to as backside back end of line (hereinafter "BBEOL") layers. The backside interconnect layer 220 may include layers of wiring and vias formed above the existing structure. In an embodiment, the backside interconnect layer 220 may include 3 or more layers of metal lines and visas. The backside interconnect layer 220 may be formed using known techniques.

A chemical mechanical polishing (CMP) technique may be used to remove excess material and polish upper surfaces of the structure 100. An upper surface of the structure 100 may include an upper horizontal surface of the backside interconnect layer 220.

The resulting structure 100 includes backside contact wiring, the backside contact 194 to the p-FET source drain 146 and the backside contact 194 to the n-FET source drain 147, the first backside power rail 199 formed by subtractive patterning and the second backside power rail 204 formed by damascene process. Specifically, the first backside power rail 199 and the second backside power rail 204 may have tapered vertical side surfaces which taper in opposite directions from each other. The first backside power rail 199 is tapered with a wider upper horizontal surface than a lower horizontal surface.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a first backside power rail directly below and connected to a source-drain epitaxy region of a positive field effect transistor (p-FET) region; and
   a second backside power rail directly below and connected to a source-drain epitaxy region of a negative field effect transistor (n-FET) region, wherein
   vertical side surfaces of the first backside power rail are tapered and a width of an upper horizontal surface of the first backside power rail is greater than a width of a lower horizontal surface of the first backside power rail, wherein
   vertical side surfaces of the second backside power rail are tapered and a width of an upper horizontal surface of the second backside power rail is less than a width of a lower horizontal surface of the second backside power rail, wherein
   the first backside power rail and the second backside power rail each comprise vertical side surfaces which taper in an opposite direction from each other.

2. The semiconductor device according to claim 1, further comprising:
   a high-k dielectric spacer between the first backside power rail and the second backside power rail, wherein the high-k dielectric spacer comprises a k value of greater than 5.

3. The semiconductor device according to claim 2, wherein
   the high-k dielectric spacer is between the n-FET region and the p-FET region.

4. The semiconductor device according to claim 1, further comprising:
   the p-FET region comprising semiconductor channel layers vertically aligned and stacked one on top of another, the semiconductor channel layers separated from each other by a gate stack material wrapping around the semiconductor channel layers; and the n-FET region comprising semiconductor channel layers vertically aligned and stacked one on top of another, the semiconductor channel layers separated from each other by a gate stack material wrapping around the semiconductor channel layers.

5. The semiconductor device according to claim 4, further comprising:

a gate cut dielectric between adjacent stacks of semiconductor channel layers within the p-FET region.

6. The semiconductor device according to claim 1, further comprising:

a dielectric pillar between the p-FET region and the n-FET region.

7. The semiconductor device according to claim 6, wherein the dielectric pillar extends vertically into a substrate of the semiconductor device.

8. A semiconductor device comprising:

a first backside power rail directly below and connected to a source-drain epitaxy region of a positive field effect transistor (p-FET) region;

a second backside power rail directly below and connected to a source-drain epitaxy region of a negative field effect transistor (n-FET) region, wherein vertical side surfaces of the first backside power rail are tapered and a width of an upper horizontal surface of the first backside power rail is greater than a width of a lower horizontal surface of the first backside power rail, wherein vertical side surfaces of the second backside power rail are tapered and a width of an upper horizontal surface of the second backside power rail is less than a width of a lower horizontal surface of the second backside power rail, wherein the first backside power rail and the second backside power rail each comprise vertical side surfaces which taper in an opposite direction from each other; and a high-k dielectric spacer between the first backside power rail and the second backside power rail, wherein the high-k dielectric spacer comprises a k value of greater than 5.

9. The semiconductor device according to claim 8, further comprising:

the high-k dielectric spacer is between the n-FET region and the p-FET region.

10. The semiconductor device according to claim 8, further comprising:

the p-FET region comprising semiconductor channel layers vertically aligned and stacked one on top of another, the semiconductor channel layers separated from each other by a gate stack material wrapping around the semiconductor channel layers; and the n-FET region comprising semiconductor channel layers vertically aligned and stacked one on top of another, the semiconductor channel layers separated from each other by a gate stack material wrapping around the semiconductor channel layers.

11. The semiconductor device according to claim 10, further comprising:

a gate cut dielectric between adjacent stacks of semiconductor channel layers within the p-FET region.

12. The semiconductor device according to claim 8, further comprising:

a dielectric pillar between the p-FET region and the n-FET region.

13. The semiconductor device according to claim 12, wherein the dielectric pillar extends vertically into a substrate of the semiconductor device.

14. A method comprising:

forming a first backside power rail by subtractive metal etch, wherein the first backside power rail is directly below and connected to a source-drain epitaxy region of a positive field effect transistor (p-FET) region; and forming a second backside power rail by damascene process, wherein the second backside power rail is directly below and connected to a source-drain epitaxy region of a negative field effect transistor (n-FET) region, wherein vertical side surfaces of the first backside power rail are tapered and a width of an upper horizontal surface of the first backside power rail is greater than a width of a lower horizontal surface of the first backside power rail, wherein vertical side surfaces of the second backside power rail are tapered and a width of an upper horizontal surface of the second backside power rail is less than a width of a lower horizontal surface of the second backside power rail, wherein the first backside power rail and the second backside power rail each comprise vertical side surfaces which taper in an opposite direction from each other.

15. The method according to claim 14, further comprising:

forming a high-k dielectric spacer between the first backside power rail and the second backside power rail.

16. The method according to claim 15, wherein the high-k dielectric spacer comprises a k value of greater than 7.

17. The method according to claim 15, wherein the high-k dielectric spacer is between the n-FET region and the p-FET region.

18. The method according to claim 14, further comprising:

forming a dielectric pillar between the p-FET region and the n-FET region, wherein the dielectric pillar extends vertically into a substrate.

19. The method according to claim 14, further comprising:

forming the p-FET region by forming a first stack of nanosheet layers on a substrate comprising alternating layers of a sacrificial and a semiconductor channel vertically aligned and stacked one on top of another; and forming the n-FET region by forming a second stack of nanosheet layers on the substrate comprising alternating layers of a sacrificial and a semiconductor channel vertically aligned and stacked one on top of another.

20. The method according to claim 19, further comprising:

forming a gate cut dielectric between the adjacent stacks of semiconductor channel layers within the p-FET region.

* * * * *